(12) United States Patent
Cha

(10) Patent No.: US 12,464,867 B2
(45) Date of Patent: Nov. 4, 2025

(54) DISPLAY DEVICE

(71) Applicant: Samsung Display Co., LTD., Yongin-si (KR)

(72) Inventor: Jong Hwan Cha, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 627 days.

(21) Appl. No.: 17/832,045

(22) Filed: Jun. 3, 2022

(65) Prior Publication Data

US 2022/0406971 A1    Dec. 22, 2022

(30) Foreign Application Priority Data

Jun. 22, 2021 (KR) ........................ 10-2021-0080560

(51) Int. Cl.
| | |
|---|---|
| *H10H 20/831* | (2025.01) |
| *H01L 25/075* | (2006.01) |
| *H01L 25/16* | (2023.01) |
| *H10H 20/832* | (2025.01) |
| *H10H 20/84* | (2025.01) |
| *H10H 20/857* | (2025.01) |
| *H10H 29/14* | (2025.01) |

(52) U.S. Cl.
CPC ...... *H10H 20/8312* (2025.01); *H10H 20/832* (2025.01); *H10H 20/84* (2025.01); *H10H 20/857* (2025.01); *H10H 29/142* (2025.01); *H01L 25/0753* (2013.01); *H01L 25/167* (2013.01)

(58) Field of Classification Search
None
See application file for complete search history.

(56) References Cited

U.S. PATENT DOCUMENTS

| | | | |
|---|---|---|---|
| 11,798,954 B2 | 10/2023 | Chang et al. | |
| 11,810,905 B2 | 11/2023 | Cho et al. | |
| 12,062,739 B2 | 8/2024 | Kim et al. | |
| 2021/0159250 A1* | 5/2021 | Chang | H10D 86/441 |
| 2021/0280746 A1 | 9/2021 | Kim et al. | |
| 2021/0305222 A1 | 9/2021 | Min et al. | |

(Continued)

FOREIGN PATENT DOCUMENTS

| | | |
|---|---|---|
| EP | 3828930 | 6/2021 |
| EP | 3828937 | 6/2021 |
| KR | 10-2019-0029831 | 3/2019 |

(Continued)

OTHER PUBLICATIONS

Extended European Search Report corresponding to European Application No./Patent No. 22180162.4 dated Nov. 11, 2022.

*Primary Examiner* — Julio J Maldonado
*Assistant Examiner* — Pinaki Das
(74) *Attorney, Agent, or Firm* — Womble Bond Dickinson (US) LLP

(57) ABSTRACT

A first electrode upper layer of an electrode upper layer of a display device and a second electrode upper layer are disposed to partially expose a top surface of the first electrode base layer and a top surface of the second electrode base layer, respectively. A first insulating layer of the display device includes contact portions partially exposing a top surface of the first electrode base layer, a top surface of the second electrode base layer, and a top surface of the pad electrode upper layer.

20 Claims, 26 Drawing Sheets

(56) References Cited

U.S. PATENT DOCUMENTS

2024/0038738 A1    2/2024  Cho et al.
2024/0363806 A1   10/2024  Kim et al.

FOREIGN PATENT DOCUMENTS

| KR | 10-2020-0006209 | 1/2020 |
| KR | 10-2020-0011629 | 2/2020 |
| KR | 10-2020-0021014 | 2/2020 |
| KR | 10-2021-0065238 | 6/2021 |

* cited by examiner

FIG. 1
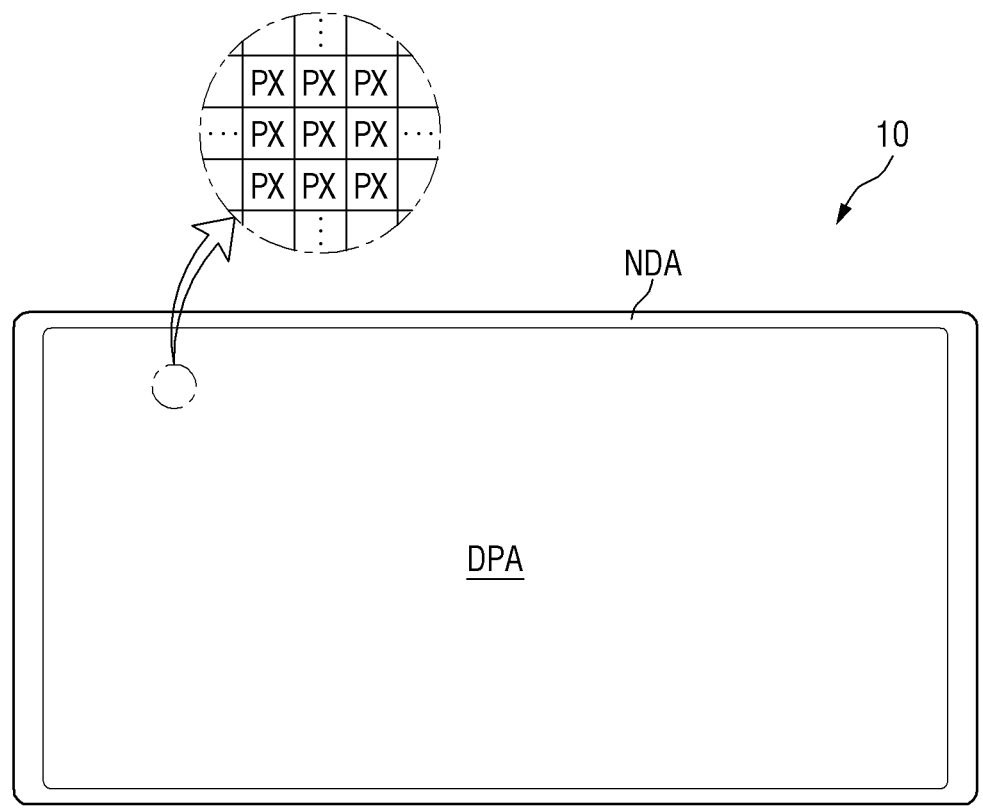
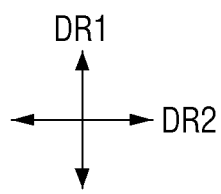

DISPLAY DEVICE

CROSS-REFERENCE TO RELATED APPLICATION(S)

This application claims priority to and benefits of Korean Patent Application No. 10-2021-0080560 under 35 U.S.C. 119, filed on Jun. 22, 2021 in the Korean Intellectual Property Office, the entire contents of which are herein incorporated by reference.

BACKGROUND

1. Technical Field

The disclosure relates to a display device.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and may include a display panel, such as an organic light emitting display panel or a liquid crystal display panel. The display panel may include a light emitting element, and the light emitting element may be a light emitting diode (LED). A light emitting diode may include an organic light emitting diode (OLED) that uses an organic material as a light emitting material, or an inorganic light emitting diode that uses an inorganic material as a light emitting material.

SUMMARY

Aspects of the disclosure provide a display device having a structure in which defects occurring at contact portions of electrodes disposed on different layers may be prevented.

However, aspects of the disclosure are not restricted to the one set forth herein. The above and other aspects of the disclosure will become more apparent to one of ordinary skill in the art to which the disclosure pertains by referencing the detailed description of the disclosure given below.

A display device according to an embodiment may include an electrode base layer and an electrode upper layer in which electrodes disposed in a display area may be made of different materials. The electrodes may have a structure in which the electrode upper layer may be prevented from being exposed and damaged in a subsequent process and the electrode base layer may contact a connection electrode. The display device may prevent an electrical connection failure between the electrode and the connection electrode and an increase in an electrical resistance.

The effects of the disclosure are not limited to the aforementioned effects, and various other effects are evident from the specification.

According to an embodiment of the disclosure, a display device may include a substrate including a display area and a pad area adjacent to the display area, a pad electrode base layer disposed in the pad area on the substrate, an electrode base layer including a first electrode base layer disposed in the display area on the substrate and a second electrode base layer spaced apart from the first electrode base layer in the display area, a pad electrode upper layer disposed on the pad electrode base layer, an electrode upper layer including a first electrode upper layer disposed on the first electrode base layer, and a second electrode upper layer disposed on the second electrode base layer, a first insulating layer disposed on the electrode upper layer and the pad electrode upper layer, and a light emitting element disposed on the first electrode base layer and the second electrode base layer on the first insulating layer. The first electrode upper layer and the second electrode upper layer may be disposed to partially expose a top surface of the first electrode base layer and a top surface of the second electrode base layer, respectively, and the first insulating layer may include contact portions partially exposing a top surface of the first electrode base layer, the a top surface of second electrode base layer, and a top surface of the pad electrode upper layer.

The first electrode upper layer may include aluminum (Al), and the first electrode base layer may include a conductive material that may not include aluminum (Al).

The pad electrode upper layer, the first electrode base layer, and the second electrode base layer may include a same material.

A side surface of the first electrode upper layer facing the second electrode base layer and a side surface of the first electrode base layer facing the second electrode base layer may be disposed on a same plane.

A side of the first electrode upper layer facing the second electrode upper layer may be disposed inwardly spaced apart from a side of the first electrode base layer facing the second electrode base layer.

The display device may further include a first insulating layer and a second insulating layer disposed on the light emitting element in the display area.

The display device may further include a third insulating layer disposed on the second insulating layer in the display area and disposed on the first insulating layer in the pad area, wherein the third insulating layer may expose a part of a top surface of the pad electrode upper layer.

The display device may further include a first pad electrode capping layer disposed on the first insulating layer and the pad electrode upper layer in the pad area, and a second pad electrode capping layer disposed on the first pad electrode capping layer, wherein a part of the third insulating layer may be disposed between the first pad electrode capping layer and the second pad electrode capping layer.

The display device may further include a first connection electrode disposed on the first electrode base layer and the first electrode upper layer and electrically contacting the light emitting element, and a second connection electrode disposed on the second electrode base layer and the second electrode upper layer and electrically contacting the light emitting element.

The first connection electrode may electrically contact the first electrode base layer through a first contact portion exposing a part of a top surface of the first electrode base layer, and the second connection electrode may electrically contact the second electrode base layer through a second contact portion exposing a part of a top surface of the second electrode base layer.

The display device may further include a bank layer surrounding an area in which the light emitting elements may be disposed on the first insulating layer, wherein the first contact portion and the second contact portion may be disposed outside the bank layer surrounding the area in which the light emitting elements may be disposed, and each of the first connection electrode and the second connection electrode may be partially disposed on the bank layer.

The display device may further include a via layer disposed between the substrate and the electrode base layer, a first conductive layer disposed between the via layer and the substrate, and an interlayer insulating layer disposed between the first conductive layer and the substrate, wherein the pad electrode base layer and the first conductive layer may be disposed on a same layer.

The first electrode base layer may electrically contact a conductive pattern of the first conductive layer through a first electrode contact hole penetrating the via layer, and the second electrode base layer may electrically contact a voltage line of the first conductive layer through a second electrode contact hole penetrating the via layer.

The first electrode upper layer may be disposed on the first electrode contact hole, and the second electrode upper layer may be disposed on the second electrode contact hole.

The display device may further include a first bank pattern disposed between the via layer and the first electrode base layer, and a second bank pattern disposed between the via layer and the second electrode base layer.

According to an embodiment of the disclosure, a display device may include a first electrode extending in a first direction and including a first electrode base layer and a first electrode upper layer partially disposed on the first electrode base layer, a second electrode spaced apart from the first electrode in a second direction and extending in the first direction, the second electrode including a second electrode base layer spaced apart from the first electrode base layer in the second direction, and a second electrode upper layer partially disposed on the second electrode base layer, light emitting elements disposed on the first electrode and the second electrode, a first connection electrode disposed on the first electrode and electrically contacting the light emitting element, and a second connection electrode disposed on the second electrode and electrically contacting the light emitting element. The first electrode base layer may include a first portion on which the first electrode upper layer may not be disposed, the second electrode base layer may include a second portion on which the second electrode upper layer may not be disposed, the first connection electrode may electrically contact the first portion of the first electrode base layer, and the second connection electrode may electrically contact the second portion of the second electrode base layer.

The first electrode upper layer may include aluminum (Al), and the first electrode base layer may include a conductive material that may not include aluminum (Al).

The display device may further include a first insulating layer disposed on the first electrode and the second electrode, wherein the first insulating layer may include a first contact portion exposing the first portion of the first electrode base layer, and a second contact portion exposing the second portion of the second electrode base layer.

The display device may further include a bank layer surrounding an emission area in which the light emitting elements may be disposed, and a sub-region adjacent to the emission area, wherein each of the first portion of the first electrode base layer and the second portion of the second electrode base layer may be disposed in the sub-region.

Each of the first connection electrode and the second connection electrode may be disposed from the emission area to the sub-region over the bank layer.

BRIEF DESCRIPTION OF THE DRAWINGS

The above and other aspects and features of the disclosure will become more apparent by describing in detail embodiments thereof with reference to the attached drawings, in which:

FIG. 1 is a schematic plan view of a display device according to an embodiment;

DETAILED DESCRIPTION OF THE EMBODIMENTS

Figure 2:
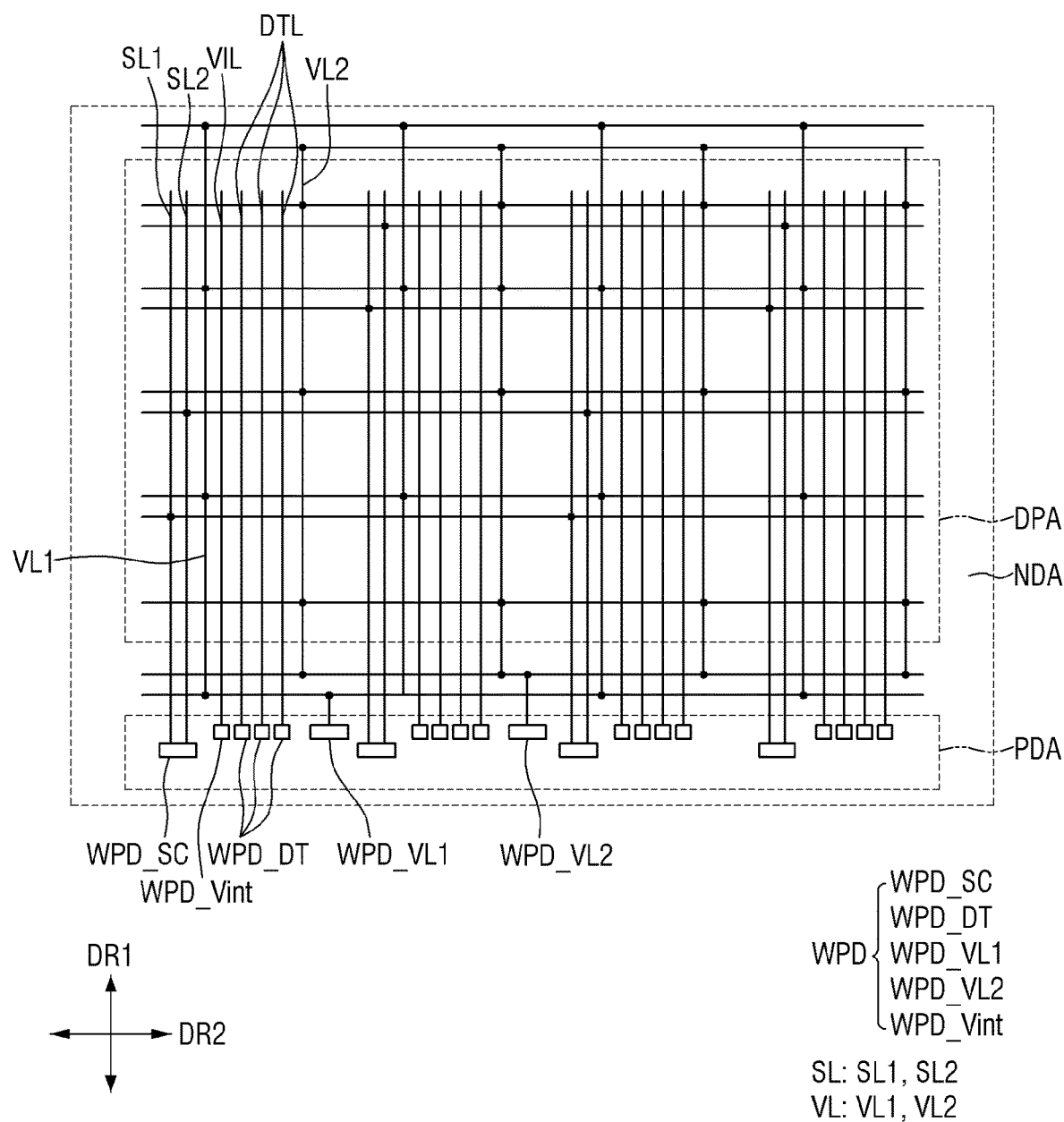
FIG. 2 is a schematic view illustrating multiple wires of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view of a display device according to an embodiment.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, or any other device which may provide a display screen.

The display device 10 may include a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be described as an example, but the disclosure is not limited thereto, and other display panels may be applied within the same scope and technical spirit.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape and a circular shape. The shape of a display area DPA of the display device 10 may also be similar to the overall shape of the display device 10. FIG. 1 illustrates a display device 10 having a rectangular shape elongated in a second direction DR2.

The display device 10 may include the display area DPA and a non-display area NDA. The display area DPA may be an area where a screen can be displayed, and the non-display area NDA may be an area where a screen is not displayed. The display area DPA may also be referred to as an active region, and the non-display area NDA may also be referred to as a non-active region. The display area DPA may substantially occupy the center of the display device 10.

The display area DPA may include pixels PX. The pixels PX may be arranged in a matrix. The shape of each pixel PX may be a rectangular or square shape in plan view. However, the disclosure is not limited thereto, and it may be a rhombic shape in which each side may be inclined with respect to a direction. The pixels PX may be disposed in a stripe type or a PenTile® type. Each of the pixels PX may include one or more light emitting elements that emit light of a specific wavelength band to display a specific color.

The non-display area NDA may be disposed adjacent to (e.g., around) the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers that may be included in the display device 10 may be disposed in the non-display area NDA, or external devices may be mounted thereon.

FIG. 2 is a schematic view illustrating multiple wires of a display device according to an embodiment.

Referring to FIG. 2, the display device 10 may include multiple wires. The wires may include scan lines SL, data lines DTL, an initialization voltage line VIL, and voltage lines VL (VL1 and VL2). Although not shown in the drawing, other wires may be further provided in the display device 10.

A scan line SL may be disposed to extend in a first direction DR1. The scan line SL may be connected to a scan line pad WPD_SC connected to a scan driver (not shown). The scan line SL may be disposed to extend from the pad area PDA disposed in the non-display area NDA to the display area DPA.

The term "connected" as used herein may mean not only that one member is connected to another member through a direct physical contact, but also that one member is connected to another member through yet another member. This may also be understood as one part and the other part as integral elements are connected into an integrated element via another element. Furthermore, if one element is connected to another element, this may be construed as a meaning including an electrical connection via another element in addition to a direct connection in physical contact.

The data lines DTL may be disposed to extend in the first direction DR1. In the data lines DTL, three data lines DTL may form a pair and may be disposed adjacent to each other. Each of the data lines DTL may be disposed to extend from the pad area PDA disposed in the non-display area NDA to the display area DPA.

The initialization voltage line VIL may also be disposed to extend in the first direction DR1. The initialization voltage line VIL may be disposed between the data lines DTL and the scan line SL. The initialization voltage line VIL may be disposed to extend from the pad area PDA disposed in the non-display area NDA to the display area DPA.

The first voltage line VL1 and the second voltage line VL2 may include a portion extending in the first direction DR1 and a portion extending in the second direction DR2. The portions of the first voltage line VL1 and the second voltage line VL2 extending in the first direction DR1 may be disposed across the display area DPA. Among the portions extending in the second direction DR2, some wires may be disposed in the display area DPA, and other wires may be disposed in the non-display area NDA located on both sides of the display area DPA in the first direction DR1. The first voltage line VL1 and the second voltage line VL2 may have a mesh structure in the entire display area DPA.

The scan lines SL, the data lines DTL, the initialization voltage line VIL, the first voltage line VL1, and the second voltage line VL2 may be electrically connected to at least one wire pad WPD. Each wire pad WPD may be disposed in the non-display area NDA. The wire pads WPD may be disposed in the pad area PDA located on a lower side that may be another side in the first direction DR1 relative to the display area DPA, and the position of the pad area PDA may be variously modified depending on the size and the specification of the display device 10. The scan lines SL may be connected to the scan line pad WPD_SC disposed in the pad area PDA, and the data lines DTL may be connected to different data line pads WPD_DT. The initialization voltage line VIL may be connected to an initialization line pad WPD_Vint, the first voltage line VL1 may be connected to a first voltage line pad WPD_VL1, and the second voltage line VL2 may be connected to a second voltage line pad WPD_VL2. The external devices may be mounted on the wire pads WPD. The external devices may be mounted on the wire pads WPD by applying an anisotropic conductive film, ultrasonic bonding or the like. The drawing shows that each of the wire pads WPD is disposed on the pad area PDA disposed on the lower side of the display area DPA, but is not limited thereto. Some of the wire pads WPD may be disposed in any area on the upper side or on the left and right sides of the display area DPA.

Each pixel PX or sub-pixel SPXn (n being an integer of 1 to 3) of the display device 10 may include a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may be variously modified. According to an embodiment, in each sub-pixel SPXn of the display device 10, the pixel driving circuit may have a 3T1C structure including three transistors and a capacitor. Hereinafter, the pixel driving circuit of the 3T1C structure will be described as an example, but the disclosure is not limited thereto, and various other modified pixel PX structures such as a 2T1C structure, a 7T1C structure, and a 6T1C structure may be applied.

Figure 3:
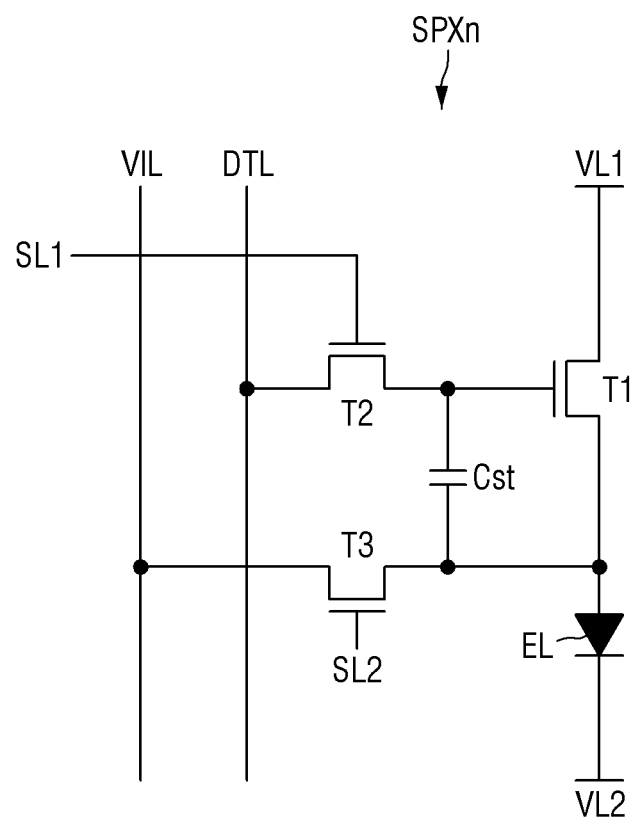
FIG. 3 is a schematic diagram of an equivalent circuit of a sub-pixel according to an embodiment.

FIG. 3 is a schematic diagram of an equivalent circuit of a sub-pixel according to an embodiment.

Referring to FIG. 3, each sub-pixel SPXn of the display device 10 according to an embodiment may include three transistors T1, T2 and T3 and a storage capacitor Cst in addition to a light emitting diode EL.

The light emitting diode EL may emit light by a current supplied through a first transistor T1. The light emitting diode EL may include a first electrode, a second electrode, and at least one light emitting element disposed between them. The light emitting element may emit light of a specific wavelength band by electrical signals transmitted from the first electrode and the second electrode.

An end of the light emitting diode EL may be connected to the source electrode of the first transistor T1, and another end thereof may be connected to the second voltage line VL2 to which a low potential voltage (hereinafter, a second power voltage) lower than a high potential voltage (hereinafter, a first power voltage) of the first voltage line VL1 may be supplied.

The first transistor T1 may adjust a current flowing from the first voltage line VL1, to which the first power voltage may be supplied, to the light emitting diode EL according to the voltage difference between the gate electrode and the source electrode. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VL1 to which the first power voltage may be applied.

The second transistor T2 may be turned on by a scan signal of a first scan line SL1 to connect the data line DTL to the gate electrode of the first transistor T1. The gate electrode of the second transistor T2 may be connected to the first scan line SL1, the source electrode thereof may be connected to the gate electrode of the first transistor T1, and the drain electrode thereof may be connected to the data line DTL.

The third transistor T3 may be turned on by a scan signal of the second scan line SL2 to connect the initialization voltage line VIL to an end of the light emitting diode EL. The gate electrode of the third transistor T3 may be connected to the second scan line SL2, the drain electrode thereof may be connected to the initialization voltage line VIL, and the source electrode thereof may be connected to an end of the light emitting diode EL or to the source electrode of the first transistor T1.

In an embodiment, the source electrode and the drain electrode of each of the transistors T1, T2, and T3 are not limited to those described above, and vice versa. Further, each of the transistors T1, T2, and T3 may be formed of a thin film transistor. In FIG. 3, each of the transistors T1, T2, and T3 has been described as being formed of an N-type metal oxide semiconductor field effect transistor (MOSFET), but is not limited thereto. For example, each of the transistors T1, T2, and T3 may be formed of a P-type MOSFET. In other embodiments, some of the transistors T1, T2, and T3 may be formed of an N-type MOSFET and the others may be formed of a P-type MOSFET.

The storage capacitor Cst may be formed between the gate electrode and the source electrode of the first transistor T1. The storage capacitor Cst may store a difference voltage between a gate voltage and a source voltage of the first transistor T1.

Hereinafter, a structure of a pixel PX of the display device 10 according to an embodiment will be described in detail with further reference to other drawings.

Figure 4:
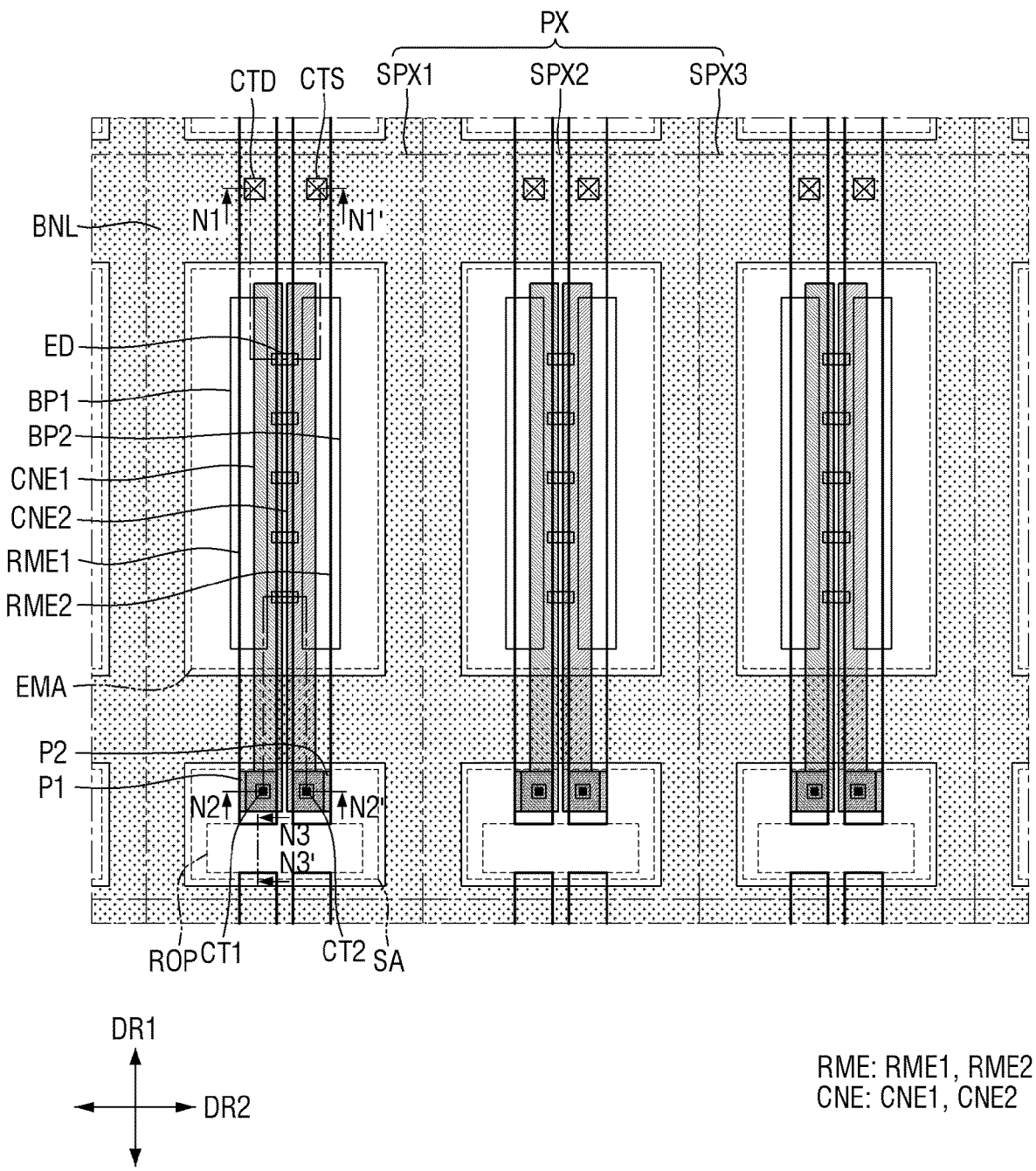
FIG. 4 is a schematic plan view illustrating a pixel of a display device according to an embodiment.

FIG. 4 is a schematic plan view illustrating a pixel of a display device according to an embodiment.

Referring to FIG. 4, each of the pixels PX of the display device 10 may include sub-pixels SPXn (n ranging from 1 to 3). For example, a pixel PX may include a first sub-pixel SPX1, a second sub-pixel SPX2 and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the disclosure is not limited thereto. For example, the sub-pixels SPXn may emit light of a same color. In an embodiment, each of the sub-pixels SPXn may emit blue light. Although it is illustrated in the drawing that a pixel PX includes three sub-pixels SPXn, the disclosure is not limited thereto. For example, the pixel PX may include a larger number of sub-pixels SPXn.

Each sub-pixel SPXn of the display device 10 may include an emission area EMA and a non-emission area. The emission area EMA may be an area in which the light emitting elements ED may be disposed to emit light of a specific wavelength band. The non-emission area may be a region in which a light emitting element ED may not be disposed and a region from which light may not be emitted because light emitted from the light emitting elements ED may not reach.

The emission area may include an area in which the light emitting elements ED may be disposed, and an area adjacent to the light emitting elements ED to emit light emitted from the light emitting elements ED. Without being limited thereto, the emission area EMA may also include an area in which light emitted from the light emitting elements ED may be reflected or refracted by another member and emitted. The light emitting elements ED may be disposed in each sub-pixel SPXn, and the emission area may be formed to include an area where the light emitting elements ED may be disposed and an area adjacent thereto.

Although it is shown in the drawing that the sub-pixels SPXn have emission areas EMA that are substantially identical in size, the disclosure is not limited thereto. In some embodiments, the emission areas EMA of the sub-pixels SPXn may have different sizes according to a color or wavelength band of light emitted from the light emitting elements ED disposed in each sub-pixel.

Each sub-pixel SPXn may further include a sub-region SA disposed in the non-emission area. The sub-region SA may be disposed at a side of the emission area EMA in the first direction DR1, and may be disposed between the emission areas EMA of the sub-pixels SPXn adjacent in the first direction DR1. For example, the emission areas EMA and the sub-regions SA may be repeatedly arranged in the second direction DR2, respectively, while being alternately arranged in the first direction DR1. However, the disclosure is not limited thereto, and the arrangement of the emission areas EMA and the sub-regions SA in the pixels PX may be different from that shown in FIG. 3.

A bank layer BNL may be disposed between the sub-regions SA and between the emission areas EMA, and the distance therebetween may vary with the width of the bank layer BNL. Light may not be emitted from the sub-region SA because the light emitting elements ED may not be disposed in the sub-region SA, but an electrode RME disposed in each sub-pixel SPXn may be partially disposed in the sub-region SA. The electrodes RME disposed in different sub-pixels SPXn may be disposed to be separated at a separation portion ROP of the sub-region SA.

The bank layer BNL may include portions extending in the first direction DR1 and the second direction DR2 in plan view to be arranged in a grid pattern over the entire surface of the display area DPA. The bank layer BNL may be disposed along the boundaries between the sub-pixels SPXn to delimit the neighboring sub-pixels SPXn. Further, the bank layer BNL may be disposed so as to surround the emission area EMA disposed for each sub-pixel SPXn to distinguish the emission areas EMA.

Figure 5:
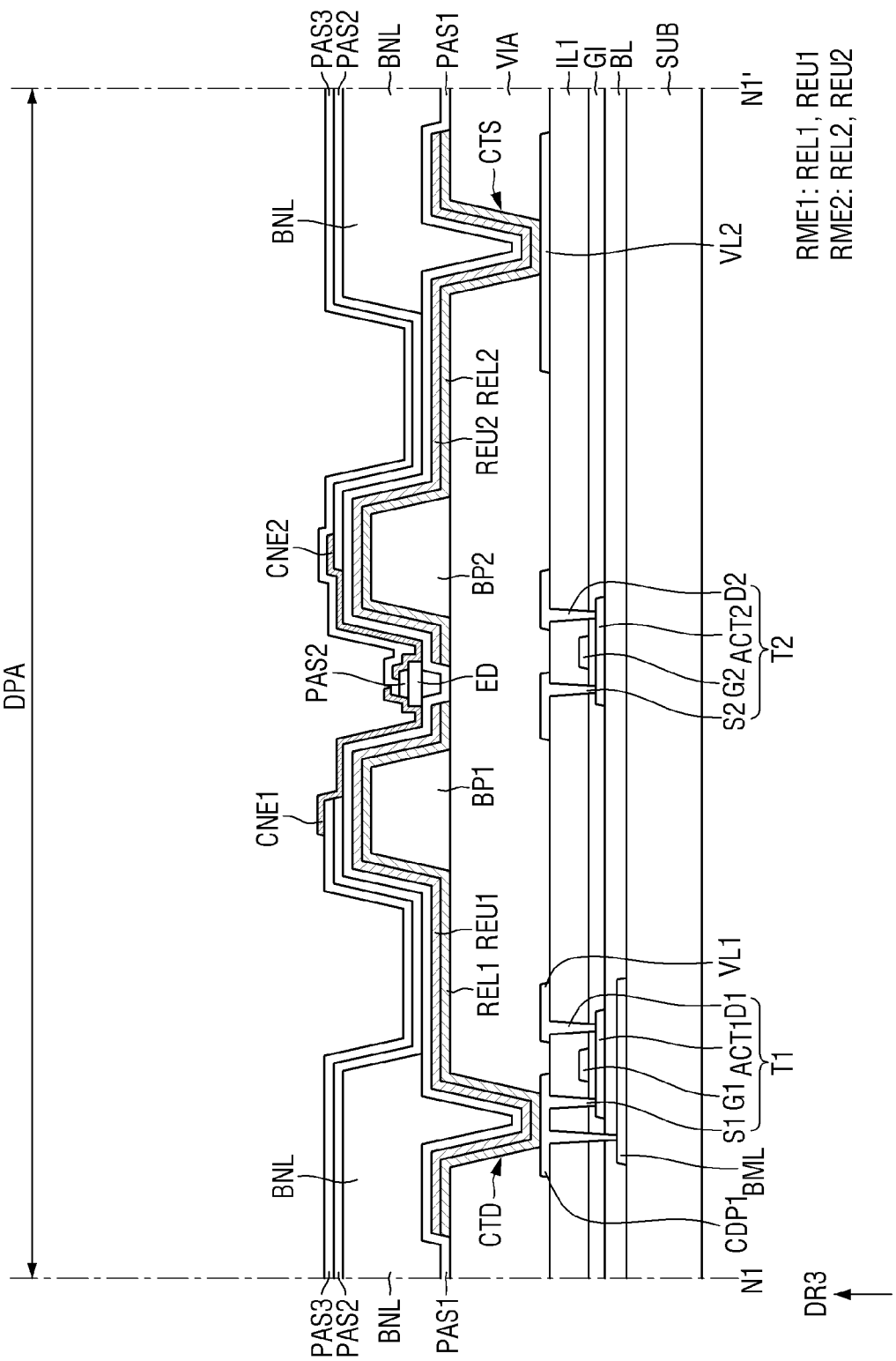
FIG. 5 is a schematic cross-sectional view taken along line N1-N1' of FIG. 4.
Figure 6:
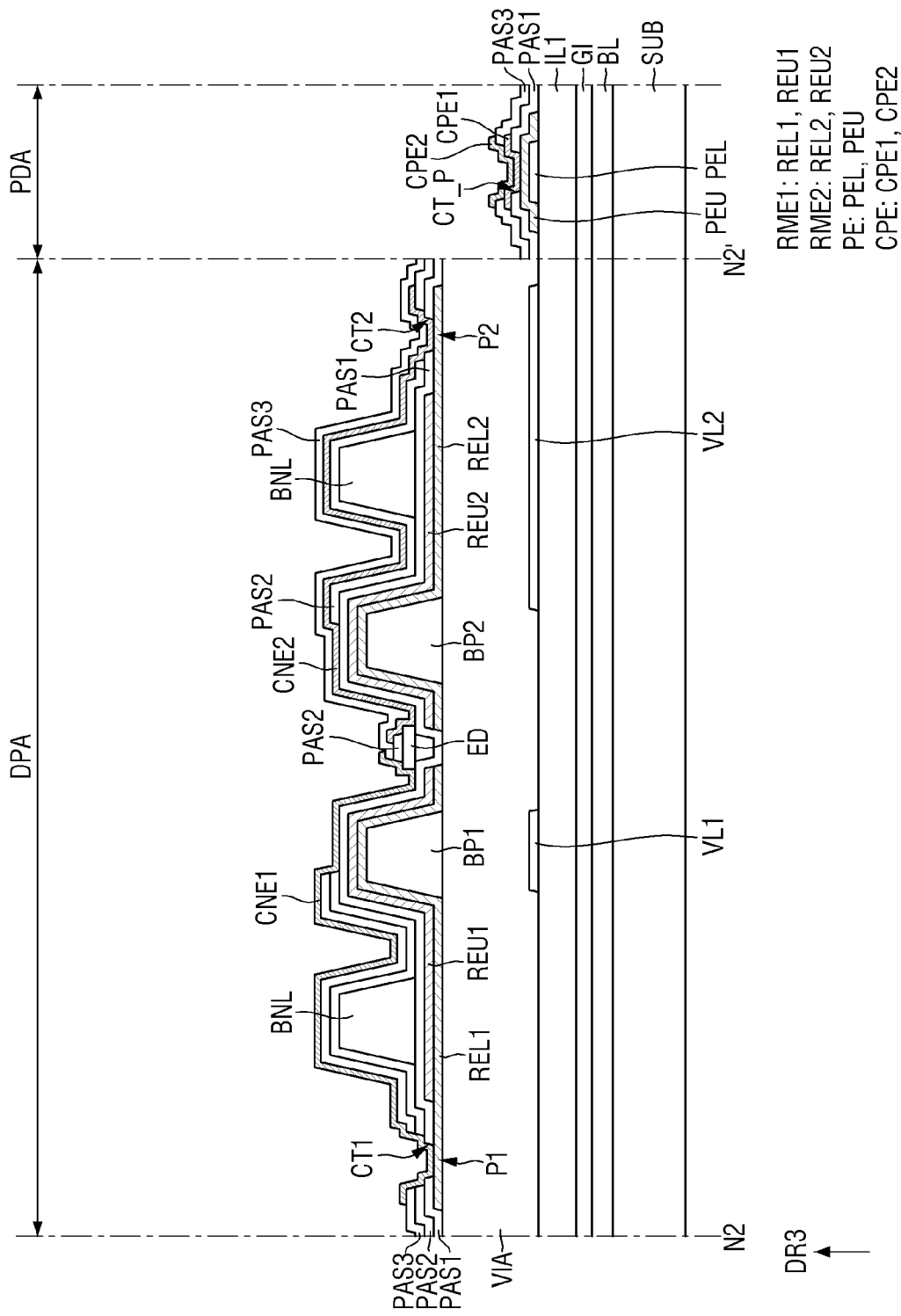
FIG. 6 is a schematic cross-sectional view showing a portion taken along line N2-N2' of FIG. 4 and a part of the pad area.
Figure 7:
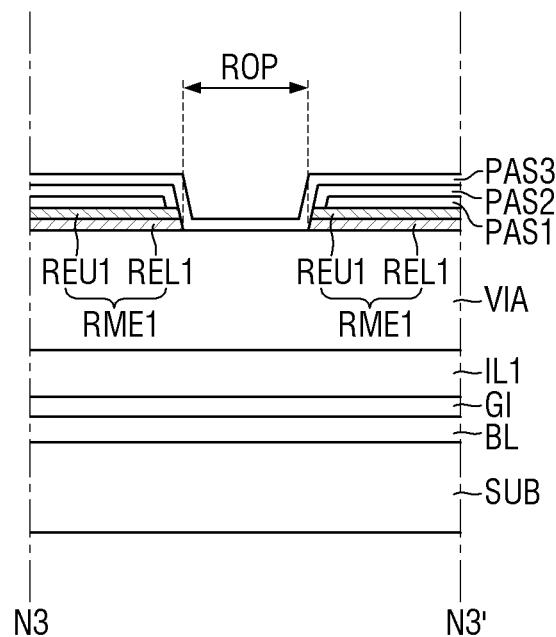
FIG. 7 is a schematic cross-sectional view taken along line N3-N3' of FIG. 4.

FIG. 5 is a schematic cross-sectional view taken along line N1-N1' of FIG. 4. FIG. 6 is a schematic cross-sectional view showing a portion taken along line N2-N2' of FIG. 4 and a part of the pad area. FIG. 7 is a schematic cross-sectional view taken along line N3-N3' of FIG. 4. FIG. 6 illustrates, as the cross section of the display area DPA and the pad area PDA, the cross section taken along line N2-N2' of FIG. 4 and the cross section across a pad electrode PE of the pad area PDA.

Referring to FIGS. 4 to 7, the display device 10 may include a substrate SUB and a semiconductor layer, conductive layers, and insulating layers disposed on the substrate SUB. The semiconductor layer, the conductive layers, and the insulating layers may each constitute a circuit layer and a display element layer of the display device 10.

Specifically, the substrate SUB may be an insulating substrate. The substrate SUB may be made of an insulating material such as glass, quartz, polymer resin, or a combination thereof. Further, the substrate SUB may be a rigid substrate, but may also be a flexible substrate which can be bent, folded or rolled. The substrate SUB may include the display area DPA, the non-display area NDA surrounding the display area DPA, and the pad area PDA corresponding to a part of the non-display area NDA.

A first conductive layer may be disposed on the substrate SUB. The first conductive layer may include a lower metal layer BML, that may be disposed to overlap an active layer ACT1 of a first transistor T1. The lower metal layer BML may include a light-blocking material to prevent light from reaching the first active layer ACT1 of the first transistor T1. However, the lower metal layer BML may be omitted.

The buffer layer BL may be disposed on the lower metal layer BML and the substrate SUB. The buffer layer BL may be formed on the substrate SUB to protect the transistors of the pixel PX from moisture permeating through the substrate SUB, which may be susceptible to moisture permeation, and may perform a surface planarization function.

The semiconductor layer may be disposed on the buffer layer BL. The semiconductor layer may include the first active layer ACT1 of the first transistor T1 and a second active layer ACT2 of the second transistor T2. The first active layer ACT1 and the second active layer ACT2 may be disposed to partially overlap a first gate electrode G1 and a second gate electrode G2 of a second conductive layer to be described later, respectively.

The semiconductor layer may include polycrystalline silicon, monocrystalline silicon, oxide semiconductor, and the like, or a combination thereof. In another embodiment, the semiconductor layer may include polycrystalline silicon. The oxide semiconductor may be an oxide semiconductor including indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although it is illustrated in the drawing that one first transistor T1 is disposed in the sub-pixel SPXn of the display device 10, but the disclosure is not limited thereto, and the display device 10 may include a larger number of transistors.

The gate insulating layer GI may be disposed on the semiconductor layer and the buffer layer BL. The gate insulating layer GI may serve as a gate insulating layer of each of the transistors T1 and T2. Although it is illustrated in the drawing that the gate insulating layer GI is disposed on the entire buffer layer BL, the disclosure is not limited thereto. In some embodiments, the gate insulating layer GI may be patterned together with the gate electrodes G1 and G2 of the second conductive layer, which will be described later, to be partially disposed between the second conductive layer and the active layers ACT1 and ACT2 of the semiconductor layer.

The second conductive layer may be disposed on the gate insulating layer GI. The second conductive layer may include a first gate electrode G1 of the first transistor T1 and a second gate electrode G2 of the second transistor T2. The first gate electrode G1 may be disposed to overlap the channel region of the first active layer ACT1 in a third direction DR3 that may be a thickness direction, and the second gate electrode G2 may be disposed to overlap the channel region of the second active layer ACT2 in the third direction DR3. Although not shown in the drawing, the second conductive layer may further include an electrode of the storage capacitor.

An interlayer insulating layer IL1 may be disposed on the second conductive layer. The interlayer insulating layer IL1 may function as an insulating layer between the second conductive layer and other layers disposed thereon, and may protect the second conductive layer.

A third conductive layer may be disposed on the interlayer insulating layer IL1. The third conductive layer may include the first voltage line VL1 and the second voltage line VL2, a first conductive pattern CDP1, source electrodes S1 and S2 and drain electrodes D1 and D2 of the respective transistors T1 and T2 which may be disposed in the display area DPA, and a pad electrode base layer PEL of the pad electrode PE disposed in the pad area PDA. Although not shown in the drawing, the third conductive layer may further include the other electrode of the storage capacitor.

The first voltage line VL1 may be applied with a high potential voltage (or a first power voltage) transmitted to the first electrode RME1, and the second voltage line VL2 may be applied with a low potential voltage (or a second power voltage) transmitted to the second electrode RME2. A part of the first voltage line VL1 may contact the first active layer ACT1 of the first transistor T1 through the contact hole penetrating the interlayer insulating layer IL1 and the gate insulating layer GI. The first voltage line VL1 may serve as a first drain electrode D1 of the first transistor T1. The second voltage line VL2 may be directly connected to the second electrode RME2 to be described later.

The first conductive pattern CDP1 may contact the first active layer ACT1 of the first transistor T1 through the contact hole penetrating the interlayer insulating layer IL1 and the gate insulating layer GI. Further, the first conductive pattern CDP1 may contact the lower metal layer BML through another contact hole. The first conductive pattern CDP1 may serve as a first source electrode S1 of the first transistor T1. Further, the first conductive pattern CDP1 may be electrically connected to a first electrode RME1, which will be described later, and the first transistor T1 may transfer the first power voltage applied from the first voltage line VL1 to the first electrode RME1.

The second source electrode S2 and the second drain electrode D2 may contact the second active layer ACT2 of the first transistor T2 through the contact holes penetrating the interlayer insulating layer IL1 and the gate insulating layer GI. The second transistor T2 may be any of the switching transistors described with reference to FIG. 3. The second transistor T2 may transfer the signal applied from the data line DTL of FIG. 3 to the first transistor T1 or may transfer the signal applied from the initialization voltage line VIL of FIG. 3 to the other electrode of the storage capacitor.

On the other hand, although it is illustrated in the drawing that the first conductive pattern CDP1 and the first and second voltage lines VL1 and VL2 are formed in a same layer, the disclosure is not limited thereto. In some embodiments, the first voltage line VL1 and the second voltage line VL2 may be formed as a different conductive layer from the first conductive pattern CDP1. For example, they may be formed as a fourth conductive layer disposed on the third conductive layer with the third conductive layer and some insulating layers interposed therebetween. The first voltage line VL1 may be electrically connected to the first drain electrode D1 of the first transistor T1 through another conductive pattern.

The pad electrode PE may be disposed in the pad area PDA and may be connected to any of the wire pads WPD. The pad electrode PE may include the pad electrode base layer PEL formed as the third conductive layer and a pad electrode upper layer PEU to be described later. Although not shown in the drawing, the pad electrode base layer PEL may be electrically connected to any of the wires disposed in the display area DPA, and the electrical signal applied from the wire pad WPD may be transmitted to the wires in the display area DPA through the pad electrode PE.

The buffer layer BL, the gate insulating layer GI, and the interlayer insulating layer IL1 described above may be formed of inorganic layers stacked on each other in an alternating manner. For example, the buffer layer BL, the gate insulating layer GI, and the interlayer insulating layer IL1 may be formed as a double layer formed by stacking, or a multilayer formed by alternately stacking, inorganic layers including at least one of silicon oxide (SiOx), silicon nitride (SiNx), and silicon oxynitride (SiOxNy). However, the disclosure is not limited thereto, and the buffer layer BL, the gate insulating layer GI, and the interlayer insulating layer IL1 may be formed as a single inorganic layer including the above-described insulating material. Further, in some embodiments, the interlayer insulating layer IL1 may be made of an organic insulating material such as polyimide (PI) or the like.

The second conductive layer and the third conductive layer may be formed as a single layer or multiple layers made of at least one of molybdenum (Mo), aluminum (Al), chromium (Cr), gold (Au), titanium (Ti), nickel (Ni), neodymium (Nd) and copper (Cu) or an alloy thereof. However, it is not limited thereto.

A via layer VIA may be disposed on the third conductive layer in the display area DPA. The via layer VIA may include an organic insulating material, for example, an organic insulating material such as polyimide (PI), to perform a surface planarization function. Since the via layer VIA may not be disposed in the pad area PDA, the pad electrode PE disposed on the interlayer insulating layer IL1 may not be covered by the via layer VIA.

On the via layer VIA, the bank patterns BP1 and BP2, the electrodes RME (RME1 and RME2), the bank layer BNL, the light emitting elements ED, and connections electrodes CNE (CNE1 and CNE2) may be disposed as the display element layer. Further, insulating layers PAS1, PAS2, and PAS3 may be disposed on the via layer VIA.

The bank patterns BP1 and BP2 may be directly disposed on the via layer VIA in the display area DPA. The bank patterns BP1 and BP2 may have a shape extending in the first direction DR1 and may be spaced apart from each other in the second direction DR2. For example, the bank patterns BP1 and BP2 may include a first bank pattern BP1 and a second bank pattern BP2 spaced apart from each other in the emission area EMA of each sub-pixel SPXn. The first bank pattern BP1 may be located on the left side that may be a side in the second direction DR2 with respect to the central portion of the emission area EMA, and the second bank pattern BP2 may be located on the right side that may be another side in the second direction DR2 with respect to the central portion of the emission area EMA. The light emitting elements ED may be arranged between the first bank pattern BP1 and the second bank pattern BP2.

The extension lengths of the bank patterns BP1 and BP2 in the first direction DR1 may be smaller than the length of the emission area EMA surrounded by the bank layer BNL in the first direction DR1. The bank patterns BP1 and BP2 may be arranged in the emission area EMA of the sub-pixel SPXn in the entire display area DPA to form an isolated (e.g., island-shaped) pattern having a small width and extending in a direction. Although it is illustrated in the drawing that two bank patterns BP1 and BP2 having a same width are arranged for each sub-pixel SPXn, the disclosure is not limited thereto. The number and the shape of the bank patterns BP1 and BP2 may vary depending on the number or the arrangement structure of the electrodes RME.

At least a part of each of the bank patterns BP1 and BP2 may protrude with respect to the top surface of the via layer VIA. The protruding parts of the bank patterns BP1 and BP2 may have inclined surfaces, and the light emitted from the light emitting element ED may be reflected by the electrode RME disposed on the bank patterns BP1 and BP2 and emitted in the upward direction of the via layer VIA. However, the disclosure is not limited thereto, and the bank patterns BP1 and BP2 may have curved semicircular or semi-elliptical outer surfaces. The bank patterns BP1 and BP2 may include an organic insulating material such as polyimide (PI), but the disclosure is not limited thereto.

The electrodes RME may have a shape extending in a direction and may be disposed for each sub-pixel SPXn. The electrodes RME may extend in the first direction DR1 to be disposed across the emission area EMA of the sub-pixel SPXn, and may be disposed to be spaced apart from each other in the second direction DR2. The electrodes RME may be electrically connected to the light emitting elements ED. The electrodes RME may be connected to the light emitting element ED through the connection electrodes CNE (CNE1 and CNE2) to be described later, and may transmit an electrical signal applied from the conductive layer disposed therebelow to the light emitting element ED.

The display device 10 may include the first electrode RME1 and the second electrode RME2 arranged in each sub-pixel SPXn. The first electrode RME1 may be located on the left side with respect to the center of the emission area EMA, and the second electrode RME2 may be located on the right side with respect to the center of the emission area EMA while being spaced apart from the first electrode RME1 in the second direction DR2. A first electrode RME1 may be disposed on the first bank pattern BP1, and a second electrode RME2 may be disposed on the second bank pattern BP2. The first electrode RME1 and the second electrode RME2 may be partially arranged in the corresponding sub-pixel SPXn and the sub-region SA over the bank layer BNL. The first electrode RME1 and the second electrode RME2 of different sub-pixels SPXn may be separated with respect to the separation portion ROP located in the sub-region SA of a sub-pixel SPXn.

The first electrode RME1 and the second electrode RME2 may be arranged at least on the inclined surfaces of the bank patterns BP1 and BP2. In an embodiment, the widths of the electrodes RME measured in the second direction DR2 may be smaller than the widths of the bank patterns BP1 and BP2 measured in the second direction DR2. The first electrode RME1 and the second electrode RME2 may be arranged to cover at least one of the side surfaces of the bank patterns BP1 and BP2 and may reflect the light emitted from the light emitting element ED.

Further, the gap between the first electrode RME1 and the second electrode RME2 spaced apart from each other in the second direction DR2 may be smaller than the gap between the bank patterns BP1 and BP2. At least a part of the first electrode RME1 and the second electrode RME2 may be directly arranged on the via layer VIA, so that the first electrode RME1 and the second electrode RME2 may be arranged on a same plane.

In accordance with an embodiment, each of the electrodes RME of the display device 10 may have a structure in which layers including different materials may be stacked on each other. The electrodes RME may include electrode base layers REL1 and REL2 directly disposed on the via layer VIA and the bank patterns BP1 and BP2, and electrode upper layers REU1 and REU2 respectively partially disposed on the electrode base layers REL1 and REL2. The first electrode RME1 may include a first electrode base layer REL1 and a first electrode upper layer REU1, and the second electrode RME2 may include a second electrode base layer REL2 and a second electrode upper layer REU2.

The electrode base layers REL1 and REL2 and the electrode upper layers REU1 and REU2 may be disposed in substantially a same pattern. The electrode base layers REL1 and REL2 and the electrode upper layers REU1 and REU2 may have a shape extending in the first direction DR1 while overlapping each other, the electrode base layers REL1 and REL2 of different electrodes RME may be spaced apart from each other in the second direction DR2, and the electrode upper layers REU1 and REU2 of the different electrodes RME may be spaced apart from each other in the second direction DR2. The electrode base layers REL1 and REL2 and the electrode upper layers REU1 and REU2 may be formed by patterning in the same process, and side portions thereof may have a single taper shape. In accordance with an embodiment, side surfaces of different electrode base layers REL1 and REL2 facing each other may be disposed on a same plane as side surfaces of different electrode upper layers REU1 and REU2 facing each other. Similar to the portion where the first electrode RME1 and the second electrode RME2 may be spaced apart from each other in FIG. 5, the electrode base layers REL1 and REL2 and the electrode upper layers REU1 and REU2 may have a shape in which side surfaces of ends thereof may be located on a same plane and may have a single taper shape. Such a structure may be obtained by the process of simultaneously patterning the electrode base layers REL1 and REL2 and the electrode upper layers REU1 and REU2 in the process of forming the electrodes RME. However, the disclosure is not limited thereto, and the electrode base layers REL1 and REL2 and the electrode upper layers REU1 and REU2 may have a double taper shape at one of the ends thereof depending on the type of the patterning process.

The electrode upper layers REU1 and REU2 may not completely cover the electrode base layers REL1 and REL2, and may be disposed to partially expose the electrode base layers REL1 and REL2. In accordance with an embodiment, the electrodes RME may include portions P1 and P2 in which the top surfaces of the electrode base layers REL1 and REL2 may be partially exposed because the electrode upper layers REU1 and REU2 may not be disposed. The first electrode RME1 may include a first portion P1 of the top surface of the first electrode base layer REL1 in which the first electrode upper layer REU1 may not be disposed, and the second electrode RME2 may include a second portion P2 of the top surface of the second electrode base layer REL2 in which the second electrode upper layer REU2 may not be disposed. The first portion P1 and the second portion P2 may be the portions in which the electrodes RME may contact an electrode of another layer, and the electrodes RME may be in direct contact with an electrode of another layer not at the electrode upper layers REU1 and REU2 but at the electrode base layers REL1 and REL2.

As described above, the electrodes RME may be disposed on the bank patterns BP1 and BP2, and the light emitted from the light emitting elements ED disposed between the bank patterns BP1 and BP2 may be reflected by the electrode RME disposed on the bank patterns BP1 and BP2 and emitted in an upward direction. Each of the electrodes RME may include a conductive material having high reflectivity to reflect the light emitted from the light emitting element ED.

In accordance with an embodiment, the electrode upper layers REU1 and REU2 of the electrodes RME may include a material having high reflectivity, and the electrode base layers REL1 and REL2 of the electrodes RME may include a material having high conductivity. For example, the electrode upper layers REU1 and REU2 may include a material including aluminum (Al) or an alloy material including aluminum (Al), nickel (Ni), lanthanum (La), or the like, or a combination thereof. The electrode base layers REL1 and REL2 may include, as a material that has high conductivity and may not include aluminum (Al), a material such as titanium (Ti), copper (Cu), ITO, IZO, and ITZO, or a combination thereof, or may have a structure in which they may be stacked on each other in one or more layers.

Each of the electrodes RME may be electrically connected to the light emitting element ED through a connection electrode CNE to be described later, and each of the electrodes RME may be in direct contact with the connection electrode CNE and the third conductive layer disposed thereunder. The material including aluminum (Al) such as the material of the electrode upper layers REU1 and REU2 may be susceptible to damage that may occur in a subsequent process after the formation of the electrode RME, or may react with solution used in the subsequent process. In case that a part of the electrode RME reacts with another solution at the portion in which the electrode RME may contact an electrode of another layer, the electrical connection with the electrode of the another layer may cause a problem or the electrical resistance on the contact surface may be remarkably increased. To this end, in the display device 10 according to an embodiment, each electrode RME may have a structure in which a layer including a material having high reflectivity and a layer including, as a material having high conductivity, a material having high durability against a subsequent process may be stacked on each other. The electrode base layers REL1 and REL2 that may be the layers including a material having high durability and high conductivity may be contact portions with electrodes of other layers at the time of electrical connection of the third conductive layer under the via layer VIA, the connection electrode CNE, and the light emitting element ED. The electrode upper layers REU1 and REU2 that may be the layers including a material having high reflectivity may be portions in which the light emitted from the light emitting element ED may be reflected. Accordingly, each of the electrodes RME may reflect the light of the light emitting element ED to have sufficient light emission efficiency and prevent a contact failure or an increase in electrical resistance at the time of connection with the connection electrode CNE and the third conductive layer.

Each of the electrodes RME may be disposed to extend from the emission area EMA to the sub-region SA, and may include a portion overlapping the bank layer BNL and a portion disposed in the sub-region SA. In accordance with an embodiment, the portions P1 and P2 of the electrodes RME in which the top surfaces of the electrode base layers REL1 and REL2 may be partially exposed may be disposed in the sub-region SA. The first portion P1 of the first electrode RME1 and the second portion P2 of the second electrode RME2 may be located in the sub-region SA, and the connection electrodes CNE may be disposed to extend from the emission area EMA to the sub-region SA over the bank layer BNL. For example, the first portion P1 and the second portion P2 may be disposed outside the bank layer BNL with respect to the emission area EMA. However, the disclosure is not limited thereto, and the first portion P1 and the second portion P2 may be located within the emission area EMA. The electrode upper layers REU1 and REU2 may be disposed to cover the electrode base layers REL1 and REL2 except the first portion P1 and the second portion P2 located in the sub-region SA.

The first electrode RME1 and the second electrode RME2 may be connected to the third conductive layer through a first electrode contact hole CTD and a second electrode contact hole CTS, respectively, which may be formed in portions overlapping the bank layer BNL. The first electrode RME1 may contact the first electrode pattern CDP1 through the first electrode contact hole CTD penetrating the via layer VIA thereunder. The second electrode RME2 may contact the second voltage line VL2 through the second electrode contact hole CTS penetrating the via layer VIA thereunder. The first electrode RME1 may be electrically connected to the first transistor T1 through the first electrode pattern CDP1, so that the first power voltage may be applied to the first electrode RME1, and the second electrode RME2 may be electrically connected to the second voltage line VL2, so that the second power voltage may be applied to the second electrode RME2.

The first electrode contact hole CTD and the second electrode contact hole CTS may be the contact holes penetrating the via layer VIA under the electrode base layers REL1 and REL2, and the third conductive layer may contact the electrode base layers REL1 and REL2 of the electrodes RME. Unlike the connection electrode CNE disposed on the electrode RME, the third conductive layer may contact the electrode base layers REL1 and REL2 disposed under the electrodes RME and having high durability, so that the electrode upper layers REU1 and REU2 may be disposed at the portion where the third conductive layer may contact the electrode RME. A part of the first electrode upper layer REU1 may be disposed on the first electrode contact hole CTD or in the first electrode contact hole CTD, and a part of the second electrode upper layer REU2 may be disposed on the second electrode contact hole CTS or in the second electrode contact hole CTS.

The pad electrode upper layer PEU made of a same material as those of the electrode base layers REL1 and REL2 and disposed on substantially a same layer as the electrode base layers REL1 and REL2 may be disposed in the pad area PDA. For example, the pad electrode upper layer PEU may include, as a material that has high conductivity and may not include aluminum (Al), a material such as titanium (Ti), copper (Cu), ITO, IZO, and ITZO, or a combination thereof, or may have a structure in which they may be stacked on each other in one or more layers. The pad electrode upper layer PEU may be disposed on the pad electrode base layer PEL, and the two may constitute the pad electrode PE. The pad electrode upper layer PEU may be formed to have a width greater than that of the pad electrode base layer PEL, thereby covering the pad electrode base layer PEL.

Since the pad area PDA may correspond to the non-display area NDA from which light may not be emitted, a material including aluminum (Al) and having high reflectivity such as the material of the electrode upper layers REU1 and REU2 in the display area DPA may not be disposed in the pad area PDA. The electrodes RME in the display area DPA may include the electrode base layers REL1 and REL2 not including aluminum (Al) and the electrode upper layers REU1 and REU2 including aluminum (Al), whereas the pad electrode PE in the pad area PDA may include the pad electrode base layer PEL made of a same material as that of the third conductive layer and the pad electrode upper layer PEU not including aluminum (Al). Since the via layer VIA may not be disposed in the pad area PDA, a stepped portion with the display area DPA may exist. However, the electrode base layers REL1 and REL2 and the pad electrode upper layer PEU may include a same material and may be formed together in a same process.

The first insulating layer PAS1 may be disposed in the entire display area DPA and the entire pad area PDA, and may be disposed on the via layer VIA, the electrodes RME, and the pad electrode PE. The first insulating layer PAS1 may protect the electrodes RME and the pad electrode PE and insulate electrodes RME different from each other. Particularly, the first insulating layer PAS1 may be disposed to cover the electrodes RME before the bank layer BNL may be formed, so that it may be possible to prevent the electrodes RME from being damaged in a process of forming the bank layer BNL. The first insulating layer PAS1 may prevent a light emitting element ED disposed thereon from being damaged by direct contact with other members.

In an embodiment, the first insulating layer PAS1 may have stepped portions such that the top surface thereof may be partially depressed between the electrodes RME spaced apart in the second direction DR2. The light emitting element ED may be disposed on the top surface of the first insulating layer PAS1, where the stepped portions may be formed, and thus a space may remain between the light emitting element ED and the first insulating layer PAS1.

In accordance with an embodiment, the first insulating layer PAS1 may be disposed to cover the electrodes RME and the pad electrode PE, and may include openings exposing parts of the top surfaces thereof. For example, the first insulating layer PAS1 may include contact portions CT1 and CT2 exposing the portions P1 and P2 of the electrodes RME in which the electrode upper layers REU1 and REU2 may not be disposed, and a pad contact portion CT_P exposing a part of the top surface of the pad electrode upper layer PEU. The first contact portion CT1 may be disposed on the first portion P1 of the first electrode RME1 in the sub-region SA, and may expose a part of the top surface of the first electrode base layer REL1. The second contact portion CT2 may be disposed on the second portion P2 of the second electrode RME2 in the sub-region SA, and may expose a part of the top surface of the second electrode base layer REL2. For example, the first contact portion CT1 and the second contact portion CT2 may be disposed outside the bank layer BNL with respect to the emission area EMA. The pad contact portion CT_P may be disposed on the pad electrode upper layer PEU in the pad area PDA. The first insulating layer PAS1 may partially expose the electrode base layers REL1 and REL2 and may completely cover the electrode upper layers REU1 and REU2.

The connection electrodes CNE to be described later may contact the electrode base layers REL1 and REL2 exposed through the first contact portion CT1 and the second contact portion CT2, and pad electrode capping layers CPE (CPE1 and CPE2) to be described later may contact the pad electrode upper layer PEU through the pad contact portion CT_P. Further, the first insulating layer PAS1 may open the top surface of the via layer VIA at the separation portion ROP where the electrodes RME of different sub-pixels SPXn may be separated.

The bank layer BNL may be disposed on the first insulating layer PAS1. The bank layer BNL may include portions extending in the first direction DR1 and the second direction DR2, and may surround the sub-pixels SPXn. Further, the bank layer BNL may surround and distinguish the emission area EMA and the sub-region SA of each sub-pixel SPXn, and may surround the outermost part of the display area DPA and distinguish the display area DPA and the non-display area NDA. The bank layer BNL may be disposed in the entire display area DPA to form a grid pattern, and the regions opened by the bank layer BNL in the display area DPA may be the emission area EMA and the sub-region SA.

The bank layer BNL may have a height, similar to the bank patterns BP1 and BP2. In some embodiments, the top surface of the bank layer BNL may have a height higher than those of the bank patterns BP1 and BP2, and a thickness of the bank layer BNL may be greater than or equal to those of the bank patterns BP1 and BP2. The bank layer BNL may prevent ink from overflowing to adjacent sub-pixels SPXn in an inkjet printing process during the manufacturing process of the display device 10. The bank layer BNL may include an organic insulating material such as polyimide, similar to the bank patterns BP1 and BP2.

The light emitting elements ED may be arranged on the first insulating layer PAS1. The light emitting element ED may have a shape extending in a direction, and may be disposed such that a direction in which the light emitting element ED extends may be parallel to the substrate SUB. As will be described later, a light emitting element ED may include semiconductor layers arranged along a direction in which the light emitting element ED extends, and the semiconductor layers may be sequentially arranged along the direction parallel to the top surface of the substrate SUB. However, the disclosure is not limited thereto, and the semiconductor layers may be arranged in the direction perpendicular to the substrate SUB in case that the light emitting element ED has another structure.

The light emitting elements ED may be disposed on the electrodes RME spaced apart from each other in the second direction DR2 between the bank patterns BP1 and BP2. The extension length of a light emitting element ED may be greater than the gap between the electrodes RME spaced apart from each other in the second direction DR2. The light emitting elements ED may have at least one end disposed on any of the electrodes RME different from each other, or may have both ends disposed on the electrodes RME different from each other, respectively. The light emitting elements ED may be disposed such that both ends thereof may be located on different electrode upper layers REU1 and REU2, or both ends thereof may be located on the electrode base layers REL1 and REL2 depending on the structure of the electrode upper layers REU1 and REU2. An extension direction of each electrode RME and an extension direction of the light emitting element ED may be disposed to be substantially perpendicular. The light emitting elements ED may be disposed to be spaced apart from each other along the first direction DR1 in which the electrodes RME extend, and may be aligned substantially parallel to each other. However, the disclosure is not limited thereto, and the light emitting elements ED may each be arranged to extend in a direction oblique to the extension direction of the electrodes RME.

The light emitting elements ED disposed in each sub-pixel SPXn may emit light of different wavelength bands depending on a material constituting the semiconductor layer. However, the disclosure is not limited thereto, and the light emitting elements ED arranged in each sub-pixel SPXn may include the semiconductor layer of a same material and emit light of a same color. The light emitting elements ED may be electrically connected to the electrode RME and the conductive layers below the via layer VIA while contacting the connection electrodes CNE (CNE1 and CNE2), and may emit light of a specific wavelength band by receiving an electrical signal.

The second insulating layer PAS2 may be disposed on the light emitting elements ED, the first insulating layer PAS1, and the bank layer BNL. The second insulating layer PAS2 may include a pattern portion disposed on the light emitting elements ED while extending in the first direction DR1 between the bank patterns BP1 and BP2. The pattern portion may be disposed to partially surround the outer surface of a light emitting element ED, and may not cover both sides or both ends of the light emitting element ED. The pattern portion may form a linear or island-like pattern in each sub-pixel SPXn in plan view. The pattern portion of the second insulating layer PAS2 may protect the light emitting element ED and fix the light emitting elements ED during a manufacturing process of the display device 10. Further, the second insulating layer PAS2 may be disposed to fill the space between the light emitting element ED and the second insulating layer PAS2 thereunder. Further, a part of the second insulating layer PAS2 may be disposed on the bank layer BNL and in the sub-regions SA. A part of the second insulating layer PAS2 disposed in the sub-region SA may not be disposed in the first contact portion CT1, the second contact portion CT2, and the separation portion ROP.

Further, the second insulating layer PAS2 may not be disposed in the pad area PDA. Since only the first insulating layer PAS1 and the third insulating layer PAS3 to be described later may be disposed in the pad area PDA, the stepped portion between the pad electrode PE and the pad electrode capping layers CPE1 and CPE2 may be minimized.

The connection electrodes CNE (CNE1 and CNE2) may be disposed on the electrodes RME and the light emitting elements ED, and may contact each of them. The connection electrode CNE may contact any end of the light emitting element ED and at least one of the electrodes RME through the contact portions CT1 and CT2 penetrating the first insulating layer PAS1 and the second insulating layer PAS2.

The first connection electrode CNE1 may have a shape extending in the first direction DR1 and may be disposed on the first electrode RME1. A portion of the first connection electrode CNE1 disposed on the first bank pattern BP1 may overlap the first electrode RME1 and extend in the first direction DR1 therefrom. The first connection electrode CNE1 may be disposed from the emission area EMA up to the sub-region SA over the bank layer BNL. The first connection electrode CNE1 may contact the first electrode base layer REL1 through the first contact portion CT1 exposing the first portion P1 of the first electrode RME1 in the sub-region SA. The first connection electrode CNE1 may contact the light emitting elements ED and the first electrode RME1 to transmit an electrical signal applied from the first transistor T1 to the light emitting element ED.

The second connection electrode CNE2 may have a shape extending in the first direction DR1 and may be disposed on the second electrode RME2. A portion of the second connection electrode CNE2 disposed on the second bank pattern BP2 may overlap the second electrode RME2 and extend in the first direction DR1 therefrom. The second connection electrode CNE2 may be disposed from the emission area EMA up to the sub-region SA over the bank layer BNL. The second connection electrode CNE2 may contact the second electrode base layer REL2 through the second contact portion CT2 exposing the second portion P2 of the second electrode RME2 in the sub-region SA. The second connection electrode CNE2 may contact the light emitting elements ED and the second electrode RME2 to transmit an electrical signal applied from the second voltage line VL2 to the light emitting element ED.

The third insulating layer PAS3 may be disposed on the second connection electrode CNE2 and the second insulating layer PAS2. The third insulating layer PAS3 may be disposed on the entire second insulating layer PAS2 to cover the second connection electrode CNE2, and the first connection electrode CNE1 may be disposed on the third insulating layer PAS3. The third insulating layer PAS3 may insulate the first connection electrode CNE1 and the second connection electrode CNE2 to prevent direct contact therebetween.

The third insulating layer PAS3 may be disposed in the entire sub-region SA except the portion where the first contact portion CT1 may be disposed, and may cover the second contact portion CT2 and the separation portion ROP. Since the first connection electrode CNE1 may be disposed at the first contact portion CT1, the third insulating layer PAS3 may expose the first contact portion CT1. Since the second connection electrode CNE2 may be disposed at the second contact portion CT2, the third insulating layer PAS3 may cover the second contact portion CT2 together with the second connection electrode CNE2. Further, the third insulating layer PAS3 may cover the separation portion ROP and be in direct contact with the top surface of the via layer VIA exposed by the electrodes RME spaced apart from each other.

The third insulating layer PAS3 may also be partially disposed in the pad area PDA, and the pad electrode capping layers CPE1 and CPE2 may be disposed on the pad electrode PE in the pad area PDA. In accordance with an embodiment, the display device 10 may include a first pad electrode capping layer CPE1 disposed on the pad electrode PE, and a second pad electrode capping layer CPE2 disposed on the first pad electrode capping layer CPE1, and the third insulating layer PAS3 may be partially disposed between the first pad electrode capping layer CPE1 and the second pad electrode capping layer CPE2.

The first pad electrode capping layer CPE1 may be disposed on the first insulating layer PAS1 disposed in the pad area PDA, and may be in direct contact with the pad electrode upper layer PEU exposed through the pad contact portion CT_P. The third insulating layer PAS3 may expose a part of the top surface of the first pad electrode capping layer CPE1 and may be partially disposed on the first pad electrode capping layer CPE1. The second pad electrode capping layer CPE2 may be disposed on the first pad electrode capping layer CPE1 and may contact the top surface of the first pad electrode capping layer CPE1 exposed by the third insulating layer PAS3.

The pad electrode capping layers CPE1 and CPE2 may include a same material as those of the connection electrodes CNE in the display area DPA and may be formed together therewith in a same process. The first pad electrode capping layer CPE1 may be formed together with the second connection electrode CNE2 in a same process and disposed under the third insulating layer PAS3, and the second pad electrode capping layer CPE2 may be formed together with the first connection electrode CNE1 in a same process and disposed on the third insulating layer PAS3. Each of the pad electrode capping layers CPE1 and CPE2 may include a conductive material, similar to the connection electrode CNE, and may be electrically connected to the pad electrode PE. Further, the pad electrode capping layers CPE1 and CPE2 may prevent the pad electrode PE from being damaged in a subsequent process.

Although not illustrated in the drawings, another insulating layer may be further disposed on the third insulating layer PAS3 and the first connection electrode CNE1. The insulating layer may function to protect the members disposed on the substrate SUB against the external environment.

The first insulating layer PAS1, the second insulating layer PAS2, and the third insulating layer PAS3 described above may include an inorganic insulating material or an organic insulating material.

The display device 10 according to an embodiment may include layers in which the electrodes RME disposed in the display area DPA may be made of different materials, e.g., the electrode base layers REL1 and REL2 and the electrode upper layers REU1 and REU2, and the portions P1 and P2 in which the electrode upper layers REU1 and REU2 may not be disposed and the electrode base layers REL1 and REL2 may be exposed. Each electrode RME may have a structure in which the electrode upper layers REU1 and REU2 may be prevented from being exposed and damaged in a subsequent process, and the electrode base layers REL1 and REL2 having relatively high durability may contact the connection electrode CNE. Accordingly, the display device 10 may prevent an electrical connection failure between the electrode RME and the connection electrode CNE and an increase in electrical resistance.

Figure 8:
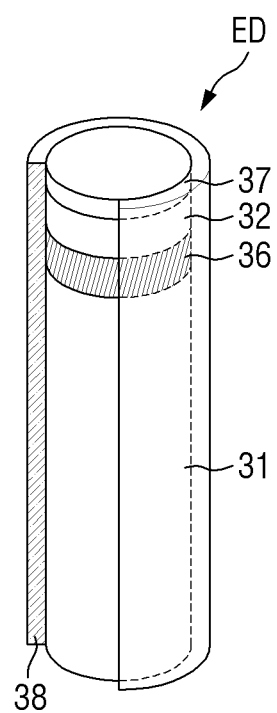
FIG. 8 is a schematic view of a light emitting element according to an embodiment.

FIG. 8 is a schematic view of a light emitting element according to an embodiment.

Referring to FIG. 8, the light emitting element ED may be a light emitting diode. Specifically, the light emitting element ED may be an inorganic light emitting diode that has a nanometer or micrometer size, and may be made of an inorganic material. The light emitting element ED may be aligned between two electrodes having polarity in case that an electric field may be formed in a specific direction between two electrodes facing each other.

The light emitting element ED according to an embodiment may have a shape elongated in a direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in a direction and having an outer surface partially inclined.

The light emitting element ED may include a semiconductor layer doped with any conductivity type (e.g., p-type or n-type) impurities. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37 and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be at least one of n-type doped AlGaInN, GaN, AlGaN, InGaN, AlN and InN. The n-type dopant doped into the first semiconductor layer 31 may be Si, Ge, Sn, or the like.

The second semiconductor layer 32 may be disposed on the first semiconductor layer 31 with the light emitting layer 36 therebetween. The second semiconductor layer 32 may be a p-type semiconductor, and the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be at least one of p-type doped AlGaInN, GaN, AlGaN, InGaN, AlN and InN. The p-type dopant doped into the second semiconductor layer 32 may be Mg, Zn, Ca, Ba, or the like.

Although it is illustrated in the drawing that the first semiconductor layer 31 and the second semiconductor layer 32 are configured as one layer, the disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, quantum layers and well layers may be stacked on each other alternately. The light emitting layer 36 may emit light by coupling of electron-hole pairs according to an electrical signal applied through the first semiconductor layer 31 and the second semiconductor layer 32. The light emitting layer 36 may include a material such as AlGaN or AlGaInN. In particular, in case that the light emitting layer 36 has a structure in which quantum layers and well layers are alternately stacked on each other in a multiple quantum well structure, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy may be alternately stacked on each other, and may include other group III to V semiconductor materials according to the wavelength band of the emitted light. The light emitted by the light emitting layer 36 is not limited to light of a blue wavelength band, but the active layer 36 may also emit light of a red or green wavelength band in some cases.

The electrode layer 37 may be an ohmic connection electrode. However, the disclosure is not limited thereto, and it may be a Schottky connection electrode. The light emitting element ED may include at least one electrode layer 37. The light emitting element ED may include one or more electrode layers 37, but the disclosure is not limited thereto, and the electrode layer 37 may be omitted.

In the display device 10, in case that the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, and ITZO.

The insulating film 38 may be arranged to surround the outer surfaces of the semiconductor layers and electrode layers described above. For example, the insulating film 38 may be disposed to surround at least the outer surface of the light emitting layer 36, and may be formed to expose both ends of the light emitting element ED in the longitudinal direction. Further, in cross-sectional view, the insulating film 38 may have a top surface, which may be rounded in a region adjacent to at least one end of the light emitting element ED.

The insulating film 38 may include a material having insulating properties, such as silicon oxide (SiOx), silicon nitride (SiNx), silicon oxynitride (SiOxNy), aluminum nitride (AlNx), or aluminum oxide AlOx, or a combination thereof. It is illustrated in the drawing that the insulating film 38 is formed as a single layer, but the disclosure is not limited thereto. In some embodiments, the insulating film 38 may be formed in a multilayer structure having layers stacked on each other therein.

The insulating film 38 may function to protect the members. The insulating film 38 may prevent an electrical short circuit that may be likely to occur at the light emitting layer 36 in case that an electrode to which an electrical signal may be transmitted is in direct contact with the light emitting element ED. The insulating film 38 may prevent a decrease in luminous efficiency of the light emitting element ED.

Further, the insulating film 38 may have an outer surface which may be surface-treated. The light emitting elements ED may be aligned in such a way of spraying the ink in which the light emitting elements ED may be dispersed on the electrodes. Here, the surface of the insulating film 38 may be treated in a hydrophobic or hydrophilic manner in order to keep the light emitting elements ED in a dispersed state without aggregation with other light emitting elements ED adjacent in the ink.

Hereinafter, a fabricating process of the display device 10 according to an embodiment will be described with reference to other drawings.

FIGS. 9 to 18 are schematic cross-sectional views illustrating a process of fabricating a display device according to an embodiment. FIGS. 9 to 18 are cross-sectional views illustrating structures corresponding to a sequence of formation of the respective layers in a sub-pixel SPXn of the display device 10. FIGS. 9 to 18 illustrate the sequence of formation of the electrodes RME in the display area DPA and the pad electrodes PE in the pad area PDA, which may respectively correspond to the cross-sectional view of FIG. 6. The process of forming the respective layers may be performed by a general patterning process. Hereinafter, the method of forming the respective layers will be briefly described, and the sequence of the formation will be described.

Figure 9:
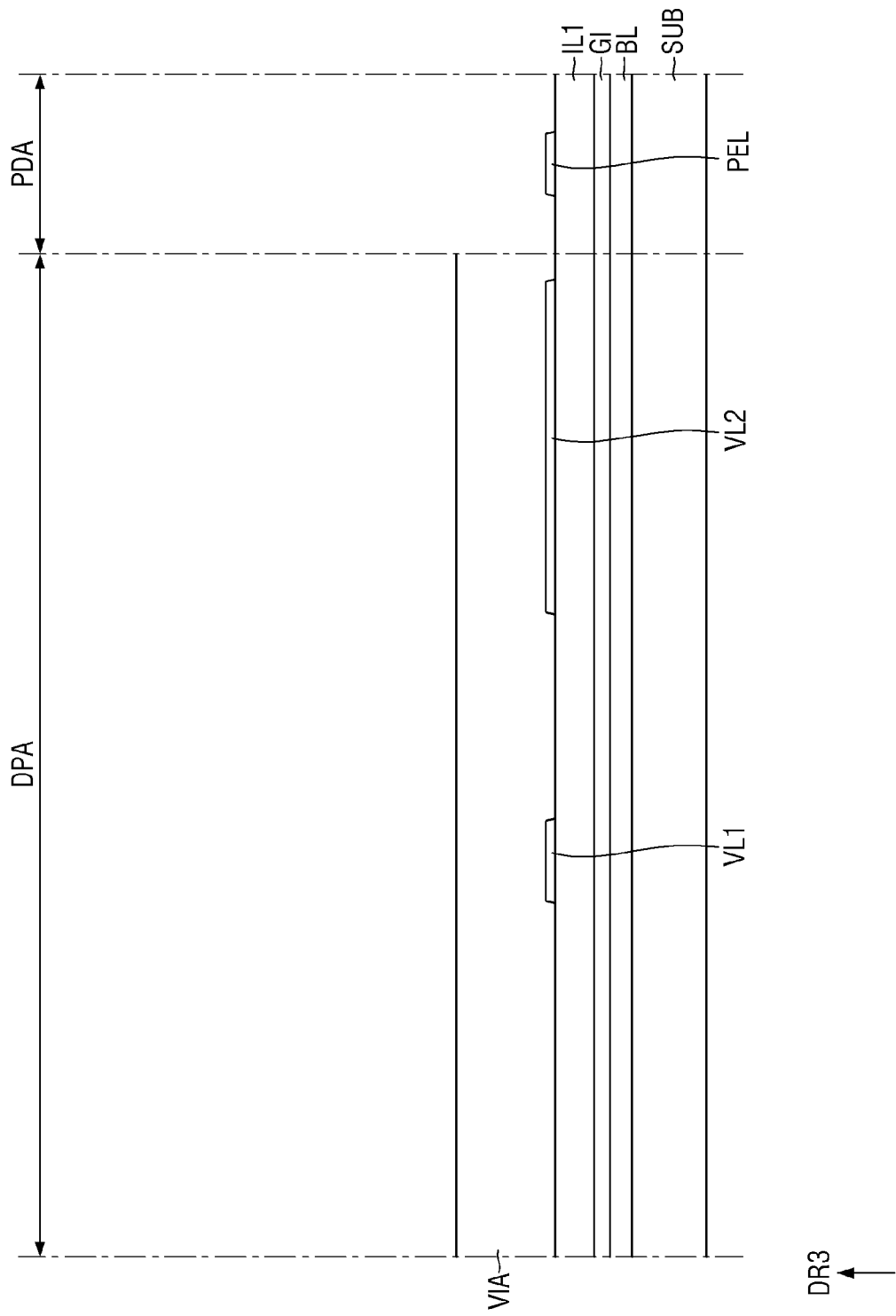
FIGS. 9 to 18 are schematic cross-sectional views illustrating a process of fabricating a display device according to an embodiment.

First, referring to FIG. 9, a substrate SUB may be prepared, and the first to third conductive layers, the buffer layer BL, the gate insulating layer GI, the interlayer insulating layer IL1, and the via layer VIA may be formed on the substrate SUB. The first to third conductive layers disposed on the substrate SUB may be formed by depositing a material, e.g., a metal material, of each of the layers, and performing a patterning process using a mask. Further, the buffer layer BL, the gate insulating layer GI, the interlayer insulating layer ILL and the via layer VIA disposed on the substrate SUB may be formed by coating a material, e.g., an insulating material, of each layer, or by a patterning process using a mask, if necessary.

Figure 10:
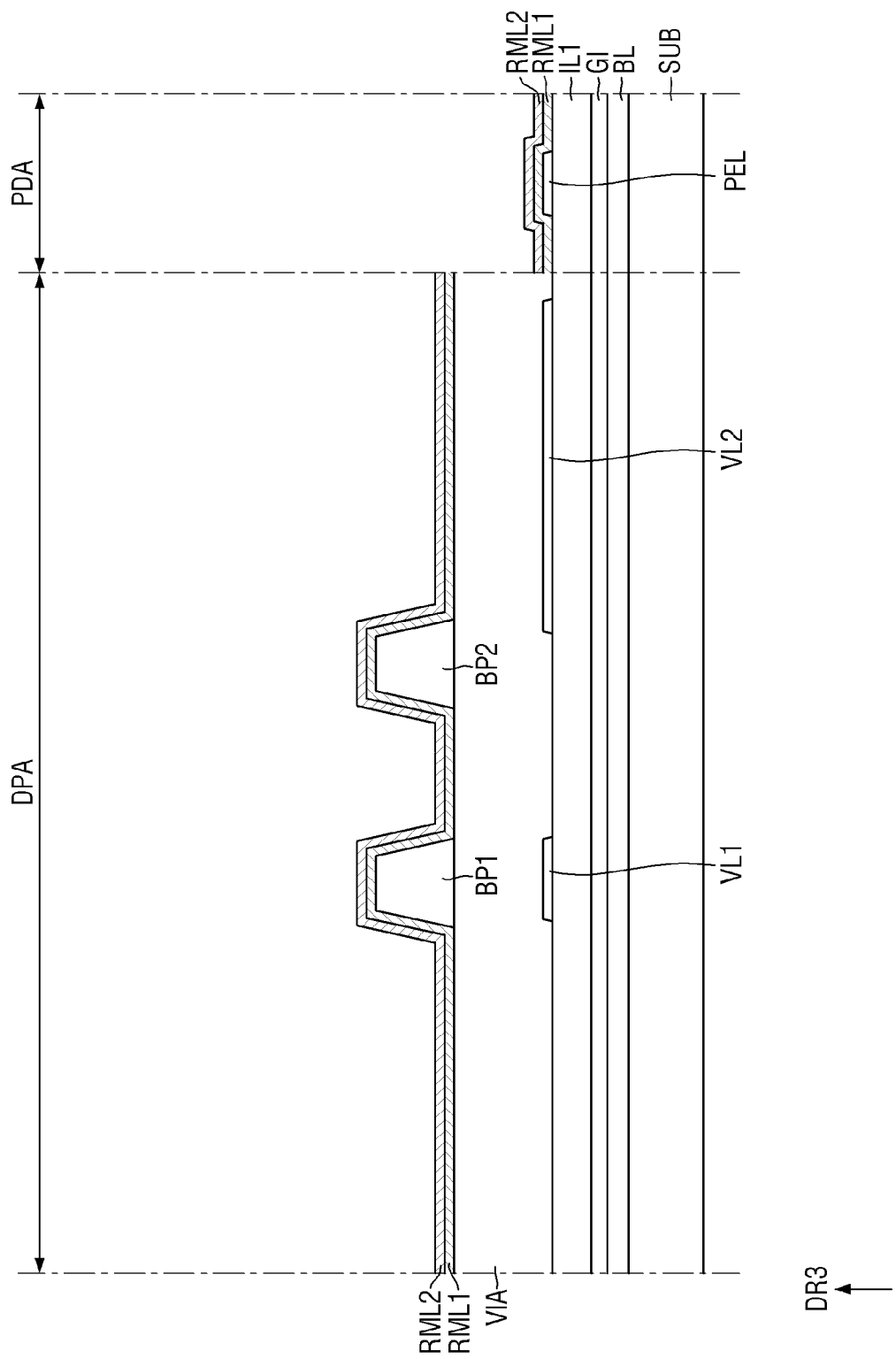

Referring to FIG. 10, the bank patterns BP1 and BP2 may be formed on the via layer VIA in the display area DPA, and metal layers RML1 and RML2 may be formed in the entire display area DPA and the entire pad area PDA. The metal layers RML1 and RML2 may include a first metal layer RML1 disposed directly on the via layer VIA and the interlayer insulating layer ILL and a second metal layer RML2 disposed on the first metal layer RML1. The first metal layer RML1 may form the electrode base layers REL1 and REL2 and the pad electrode upper layer PEU by a patterning process to be described later, and the second metal layer RML2 may form the electrode upper layers REU1 and REU2. In accordance with an embodiment, the first metal layer RML1 may include a conductive material not including aluminum (Al), and the second metal layer RML2 may include aluminum (Al). The metal layers RML1 and RML2 may be formed by consecutively performing a process of depositing the metal material on the substrate SUB.

Referring to FIGS. 11 to 15, the metal layers RML1 and RML2 may be patterned to form the electrodes RME and the pad electrode upper layer PEU.

Figure 11:
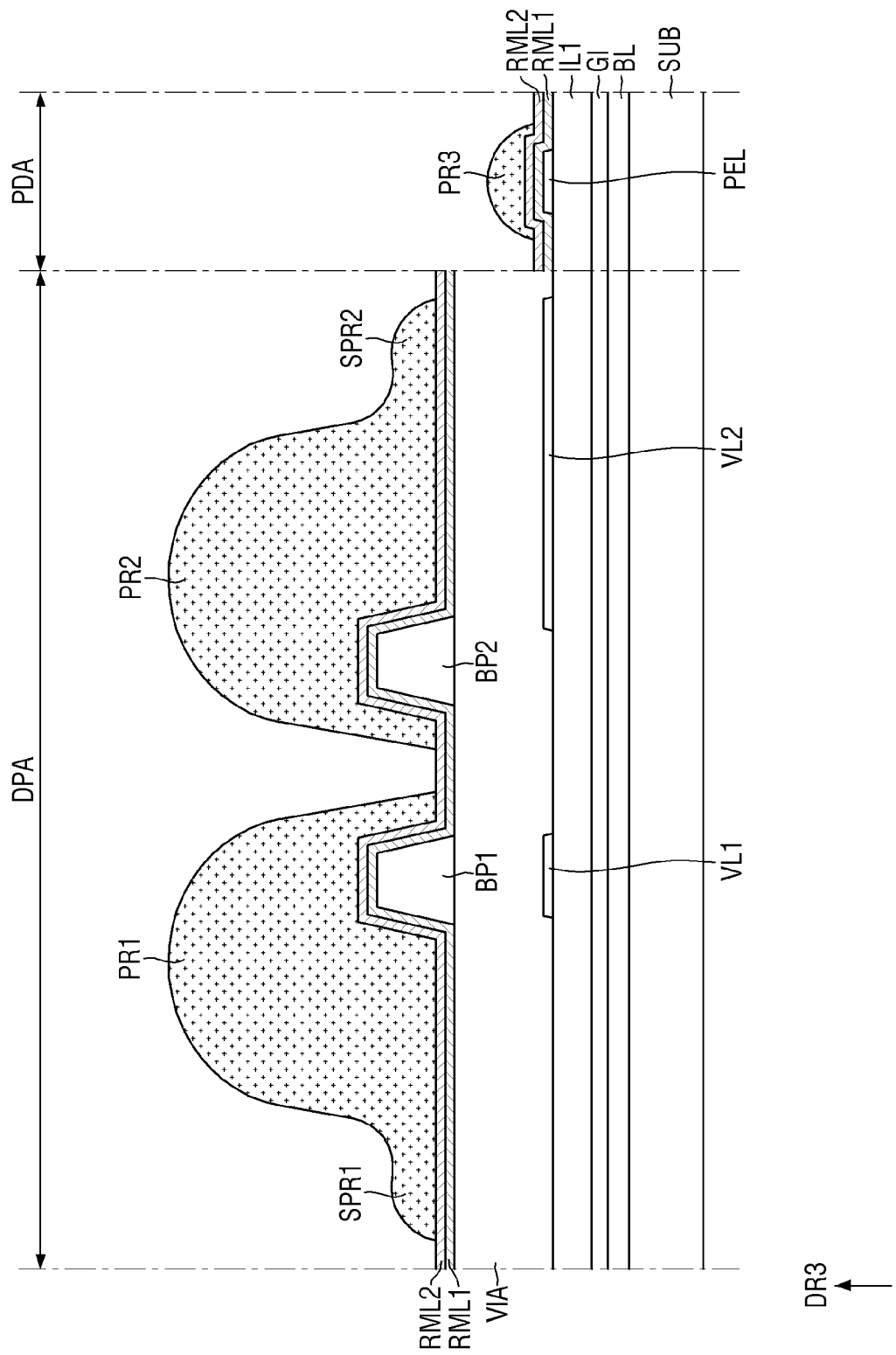

First, as shown in FIG. 11, photoresists PR1, PR2, and PR3 may be formed on the metal layers RML1 and RML2. The photoresists PR1, PR2, and PR3 may be formed by a process of coating a photoresist material on the entire metal layers RML1 and RML2 and performing exposure and development. Each of the photoresists PR1, PR2, and PR3 may be used as a mask of the patterning process for forming each electrode RME and the pad electrode upper layer PEU.

The first photoresist PR1 may be disposed to cover the first bank pattern BP1 and used as a mask for forming the first electrode RME1, the second photoresist PR2 may be disposed to cover the second bank pattern BP2 and used as a mask for forming the second electrode RME2, and the third photoresist PR3 may be disposed to cover the pad electrode base layer PEL and used as a mask for forming the pad electrode upper layer PEU of the pad electrode PE.

In the process of patterning the metal layers RML1 and RML2, the first metal layer RML1 and the second metal layer RML2 may have different patterning shapes depending on positions, and the layers remaining after the patterning may have different structures. As described above, the electrode upper layers REU1 and REU2 may be partially disposed on the electrode base layers REL1 and REL2, and the second metal layer RML2 disposed on the pad electrode upper layer PEU may be completely removed.

In accordance with an embodiment, in the manufacturing process of the display device 10, the photoresists PR1, PR2, and PR3 may have different thicknesses depending on the patterning shapes or the patterning amounts of the metal layers RML1 and RML2 disposed thereunder. For example, the first photoresist PR1 and the second photoresist PR2 may have relatively large thicknesses than that of the third photoresist PR3, and portions SPR1 and SPR2 may have a same thickness as that of the third photoresist PR3. Each of the first photoresist PR1 and the second photoresist PR2 may have a main portion having a large thickness and sub-portions SPR1 and SPR2 having a same thickness as that of the third photoresist PR3. At the main portions of the first photoresist PR1 and the second photoresist PR2, both the first metal layer RML1 and the second metal layer RML2 disposed thereunder may remain. At the third photoresist PR3, and the sub-portions SPR1 and SPR2 of the first photoresist PR1 and the second photoresist PR2, only the first metal layer RML1 may remain. The shapes of the photoresists PR1, PR2, and PR3 may be formed by an exposure and development process using a halftone mask, a slit mask, or the like. The thicknesses of the photoresists PR1, PR2, and PR3 may vary depending on the patterning shapes of the metal layers RML1 and RML2 disposed thereunder, which may depend on the shapes of the electrode RME and the pad electrode PE of the display device 10.

Figure 12:
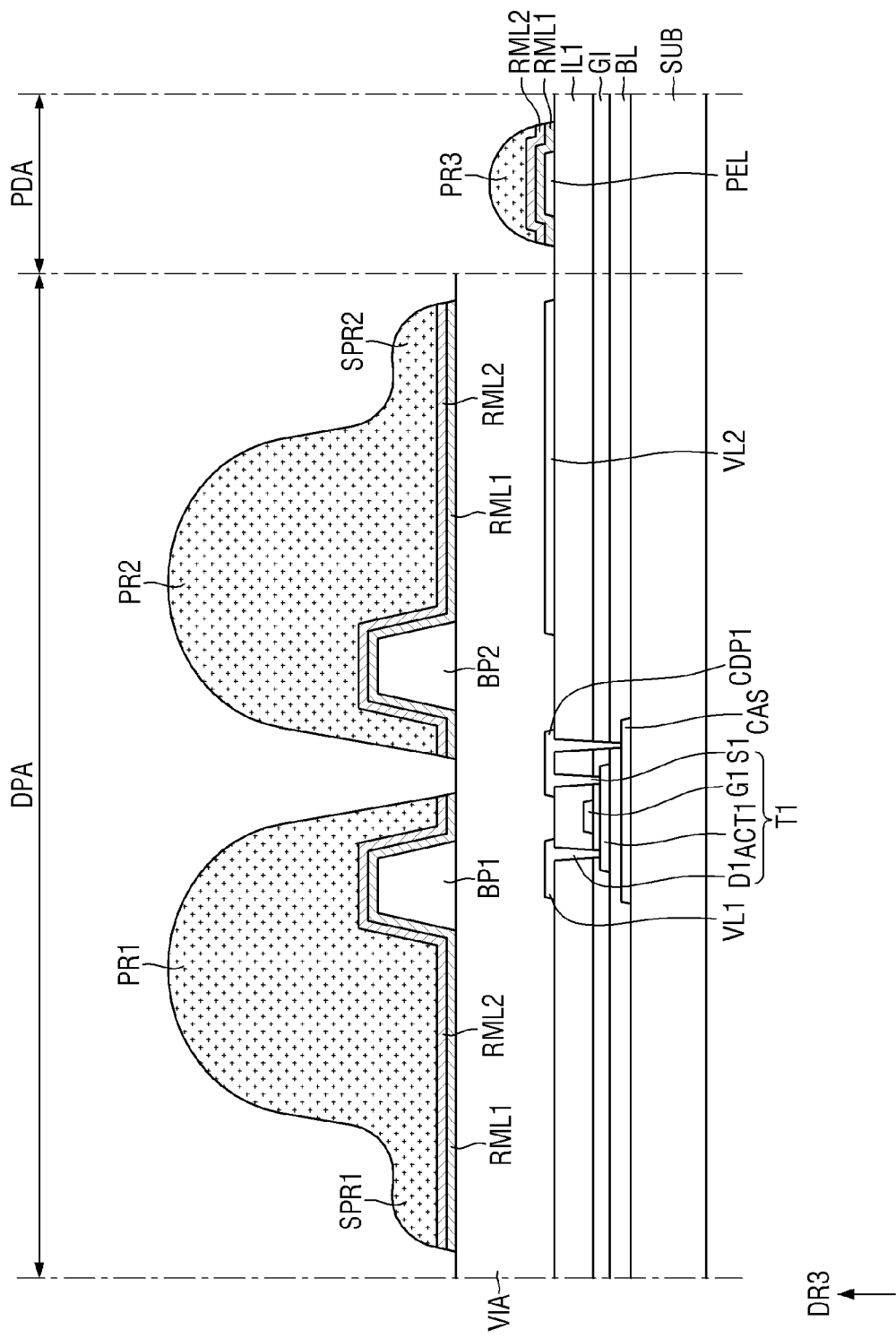

As shown in FIG. 12, the metal layers RML1 and RML2 may be patterned using the photoresists PR1, PR2, and PR3 as a mask. In this step, which may be a process of patterning both the first metal layer RML1 and the second metal layer RML2, portions of the metal layers RML1 and RML2 in which the photoresists PR1, PR2 and PR3 may not be disposed may be removed. For example, since the photoresists PR1, PR2, and PR3 may not be disposed in the area between the bank patterns BP1 and BP2, the metal layers RML1 and RML2 may be removed.

The process of patterning both the first metal layer RML1 and the second metal layer RML2 may be performed by a dry etching process or a wet etching process. Since the first metal layer RML1 and the second metal layer RML2 may include different materials as described above, an etch selectivity may be different depending on an etchant. In the process of simultaneously patterning the metal layers RML1 and RML2, the etching process may be selected depending on materials of the metal layers RML1 and RML2. For example, the first metal layer RML1 and the second metal layer RML2 may be simultaneously patterned by the dry etching process, and the cross sections of the portions of the metal layers RML1 and RML2 removed by the patterning may be located on a same plane. For example, the patterned metal layers RML1 and RML2 may have a single taper shape at a patterning portion. Since this etching process may be performed by the dry etching process, side surfaces of the electrode base layers REL1 and REL2 and the electrode upper layers REU1 and REU2 of the electrodes RME may be located on a same plane. However, the disclosure is not limited thereto, and in case that this etching process is performed by the wet etching process, side surfaces of the electrode base layers REL1 and REL2 and the electrode upper layers REU1 and REU2 of the electrodes RME may have a double taper shape.

Figure 13:
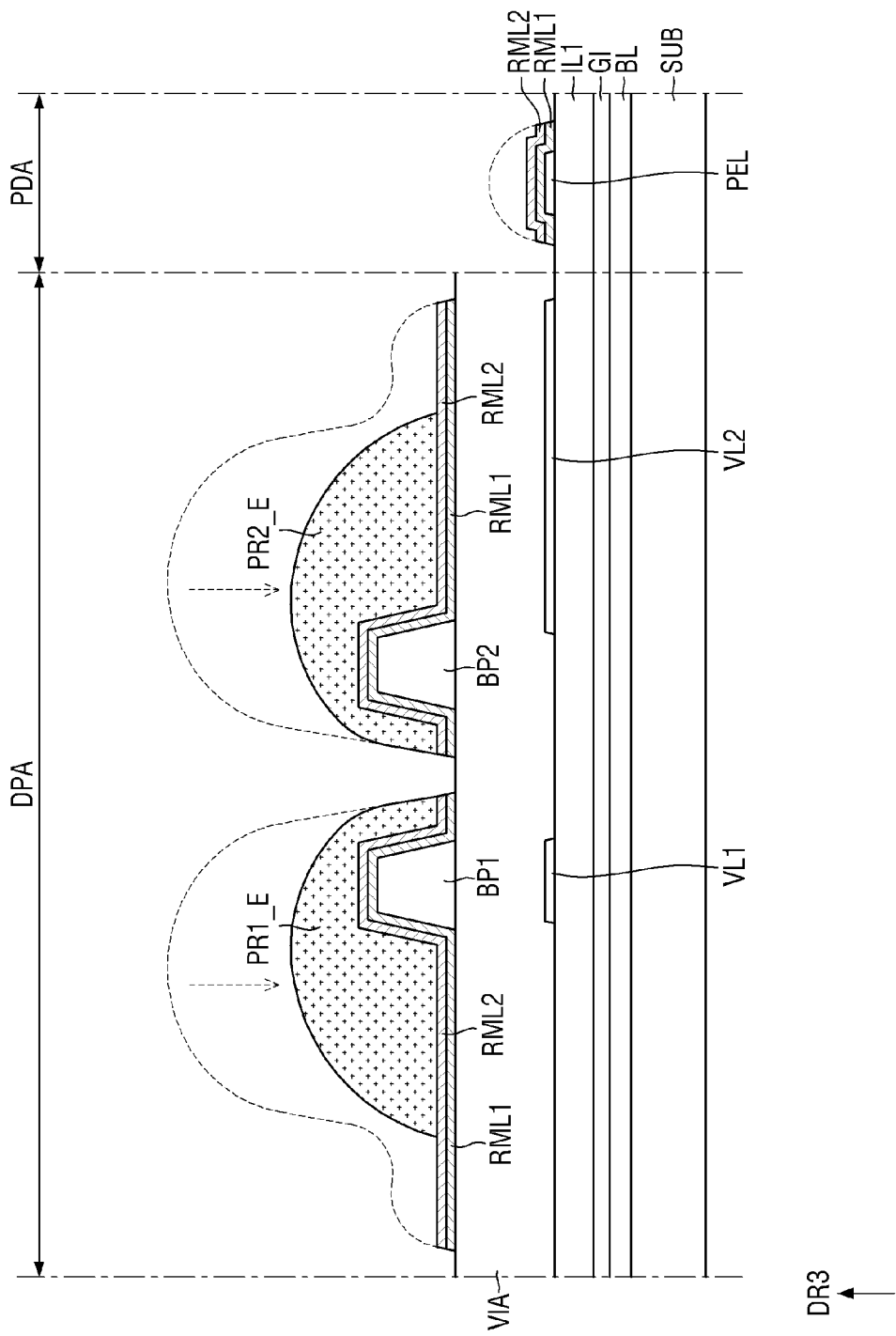

Referring to FIG. 13, an etch-back process for partially removing the photoresist PR1, PR2, and PR3 may be performed. In case that the photoresists PR1, PR2, and PR3 are etched-back, some photoresist materials are removed. Here, the shapes of photoresists PR1_E and PR2_E remaining after the etch-back may vary depending on the thicknesses of the photoresists PR1, PR2, and PR3. Since the photoresists PR1, PR2, and PR3 may be formed to have different thicknesses using the halftone mask, the third photoresist PR3, and the sub-portions SPR1 and SPR2 of the first photoresist PR1 and the second photoresist PR2 having a relatively small thickness may be removed, and the main portions of the first photoresist PR1 and the second photoresist PR2 may remain (PR1_E and PR2_E of FIG. 13). The second metal layer RML2 may be exposed at the portion in which the photoresist may be removed by the etch-back process, and the photoresists PR1_E and PR2_E that have been subjected to the etch-back process may be used as a mask for patterning the second metal layer RML2.

Figure 14:
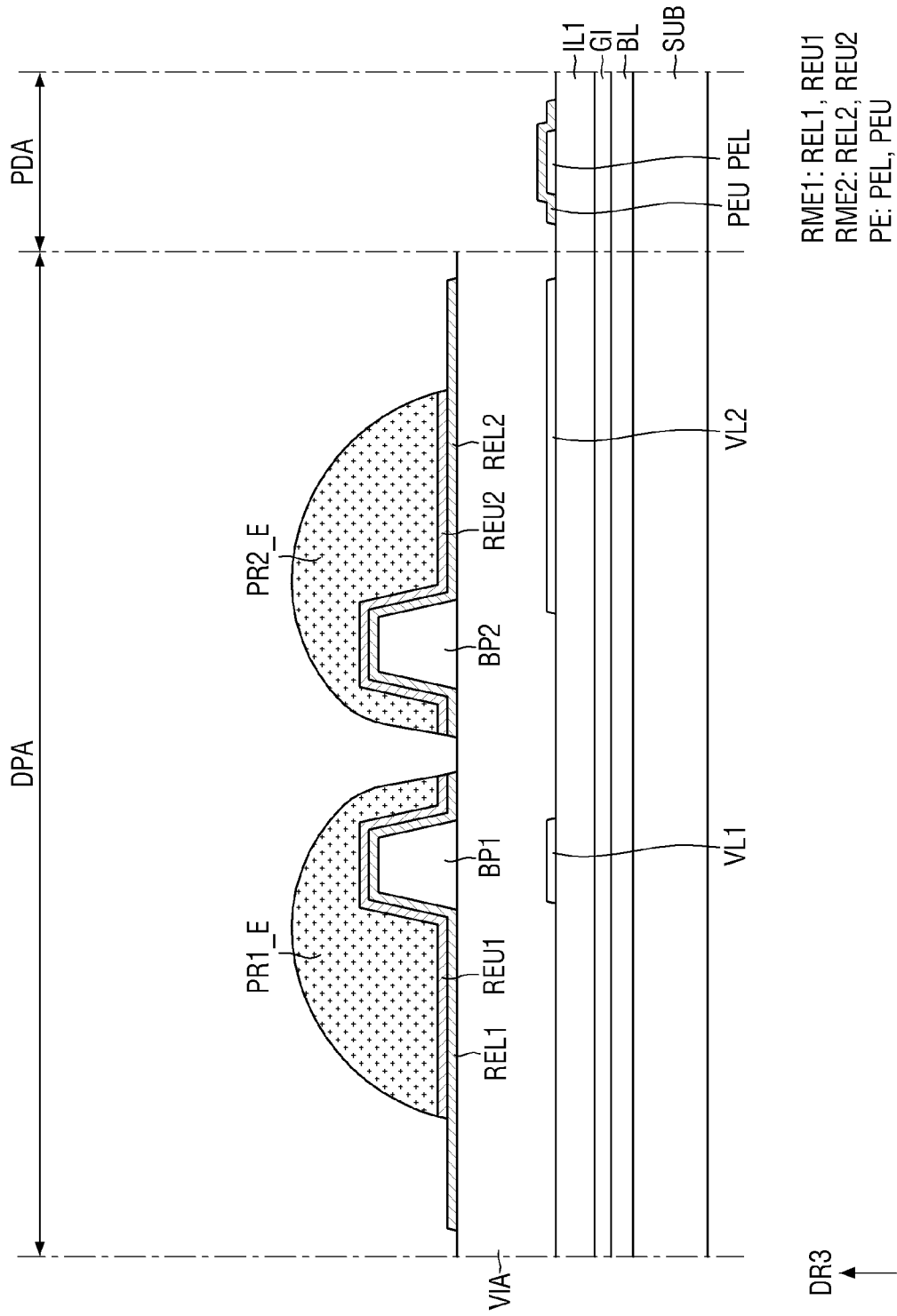
Figure 15:
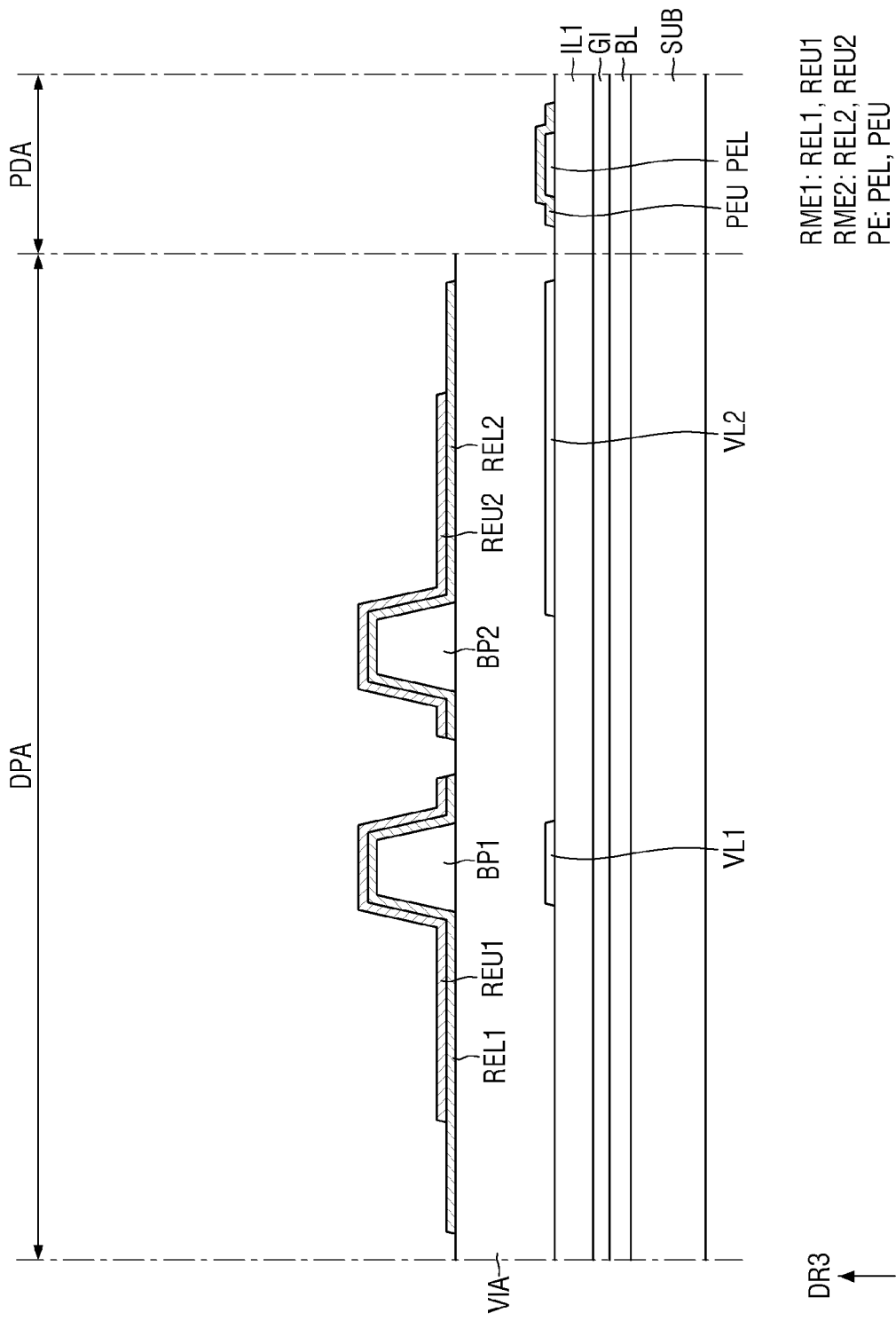

Referring to FIGS. 14 and 15, the second metal layer RML2 may be partially patterned while using the photoresists PR1_E and PR2_E that have been subjected to the etch-back process as a mask, and the photoresists PR1_E and PR2_E may be removed after the patterning process. This process, which may be a process of selectively removing only the second metal layer RML2 that may be exposed because the photoresists PR1_E and PR2_E may not be disposed may be performed by the dry etching process or the wet etching process. Since the first metal layer RML1 and the second metal layer RML2 include different materials, only the second metal layer RML2 may be selectively removed using an etchant having an etch selectivity.

In case that the second metal layer RML2 is partially removed, the electrode base layers REL1 and REL2 formed of the first metal layer RML1 and the electrode upper layers REU1 and REU2 formed of the second metal layer RML2 are formed in the display area DPA. In the pad area PDA, the pad electrode upper layer PEU formed of the first metal layer RML1 may be formed and the second metal layer RML2 may be completely removed. The electrodes RME including the electrode base layers REL1 and REL2 and the electrode upper layers REU1 and REU2 and the pad electrode upper layer PEU may be formed by the processes described with reference to FIGS. 11 to 15. In the electrode RME formed using the photoresists PR1, PR2, and PR3 formed by the process using the halftone mask as a mask, the electrode upper layers REU1 and REU2 may be partially disposed on the electrode base layers REL1 and REL2, and the electrode RME may include the portions P1 and P2 in which the electrode base layers REL1 and REL2 may be exposed. The pad electrode PE may include the pad electrode base layer PEL disposed on a same layer as the third conductive layer and the pad electrode upper layer PEU including a same material as those of the electrode base layers REL1 and REL2, and the layer including the same material as those of the electrode upper layers REU1 and REU2 may not be disposed in the pad area PDA.

Figure 16:
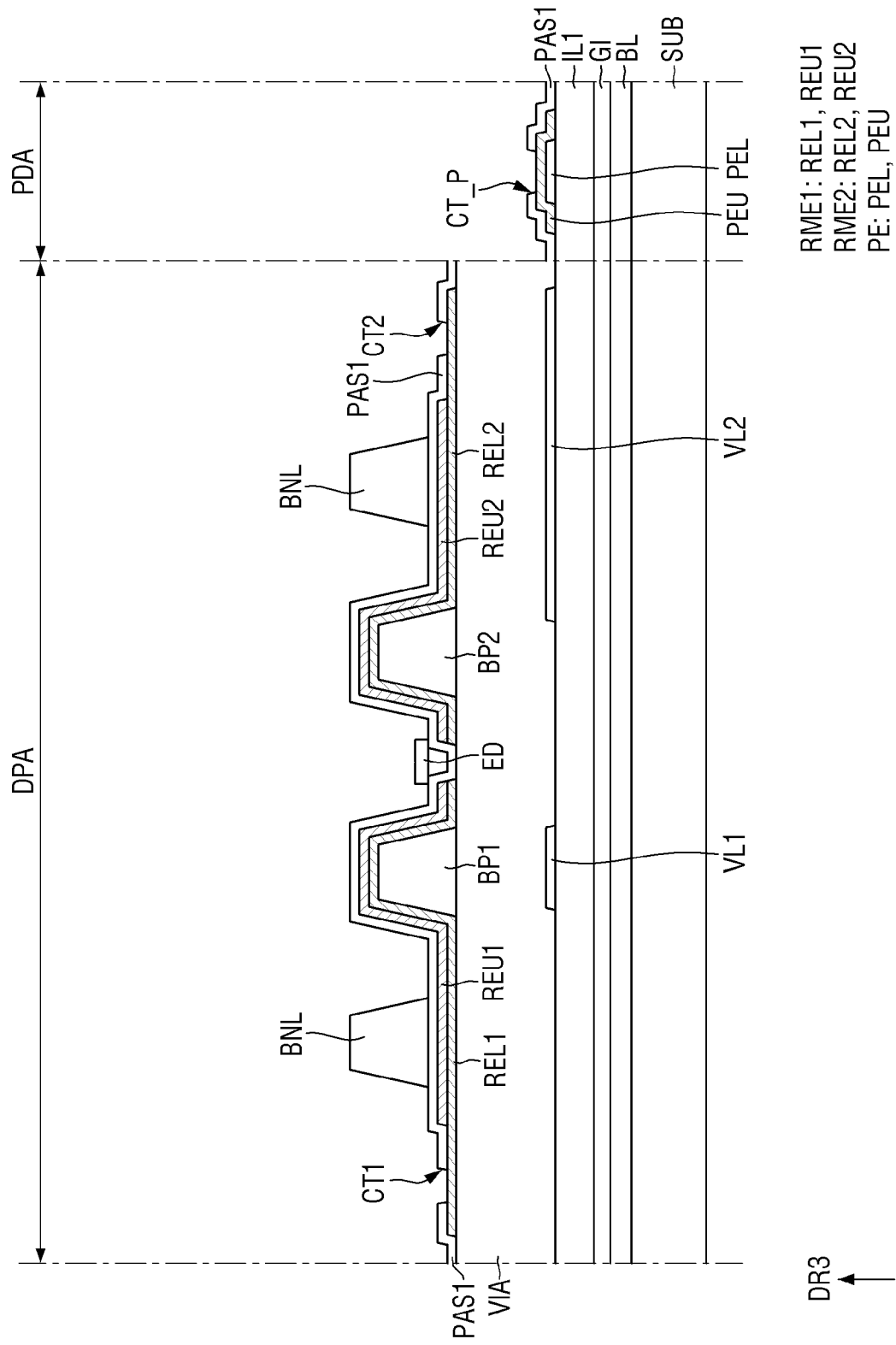

Referring to FIG. 16, the first insulating layer PAS1 partially covering the electrodes RME and the pad electrode PE, and the bank layer BNL disposed on the first insulating layer PAS1 may be formed, and the light emitting elements ED may be disposed on the first electrode RME1 and the second electrode RME2.

The first insulating layer PAS1 may be disposed in the entire display area DPA and the entire pad area PDA while covering the electrodes RME and the pad electrode PE, and may include the contact portions CT1, CT2, and CT_P respectively exposing parts of the top surfaces of the electrode base layers REL1 and REL2 and the pad electrode upper layer PEU. The electrode base layers REL1 and REL2 and the pad electrode upper layer PEU may be exposed at the contact portions CT1, CT2, and CT_P, and each of the electrode upper layers REU1 and REU2 may be covered by the first insulating layer PAS1. Even if a subsequent process may be performed after the formation of the first insulating layer PAS1, it may be possible to prevent the electrode upper layers REU1 and REU2 from being damaged.

In an embodiment, the light emitting elements ED may be disposed on the electrode RME by an inkjet printing process. In case that an electrical signal is applied to the electrodes RME after an ink in which the light emitting elements ED may be dispersed is sprayed into the area surrounded by the bank layer BNL, the light emitting elements ED in the ink may be placed on the electrodes RME while changing their own positions and orientation directions.

Figure 17:
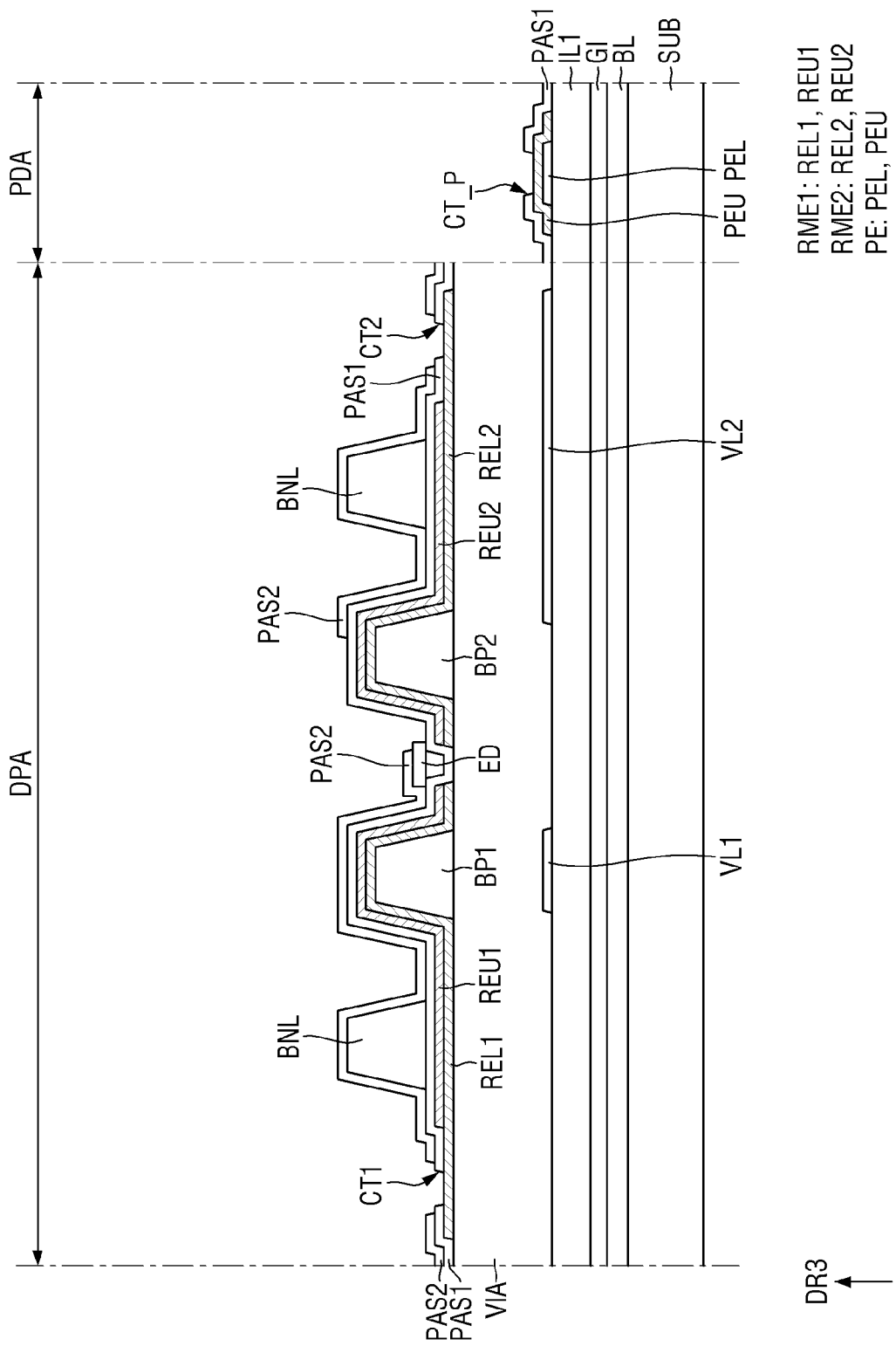

Referring to FIG. 17, the second insulating layer PAS2 may be formed on light emitting elements ED and the first insulating layer PAS1 in the display area DPA. The second insulating layer PAS2 may be disposed so as not to cover the first contact portion CT1 and the second contact portion CT2 in the display area DPA, and may not be disposed in the pad area PDA. The second insulating layer PAS2 may cover and fix the light emitting elements ED. The second insulating layer PAS2 may be coated on the entire first insulating layer PAS1 in the display area DPA and may be subjected to a patterning process for exposing both ends of the light emitting elements ED. FIG. 17 illustrates that the second insulating layer PAS2 may be disposed to expose only one end of a light emitting element ED. The second insulating layer PAS2 may be patterned to expose the opposite end of the light emitting element ED in a subsequent process.

Figure 18:
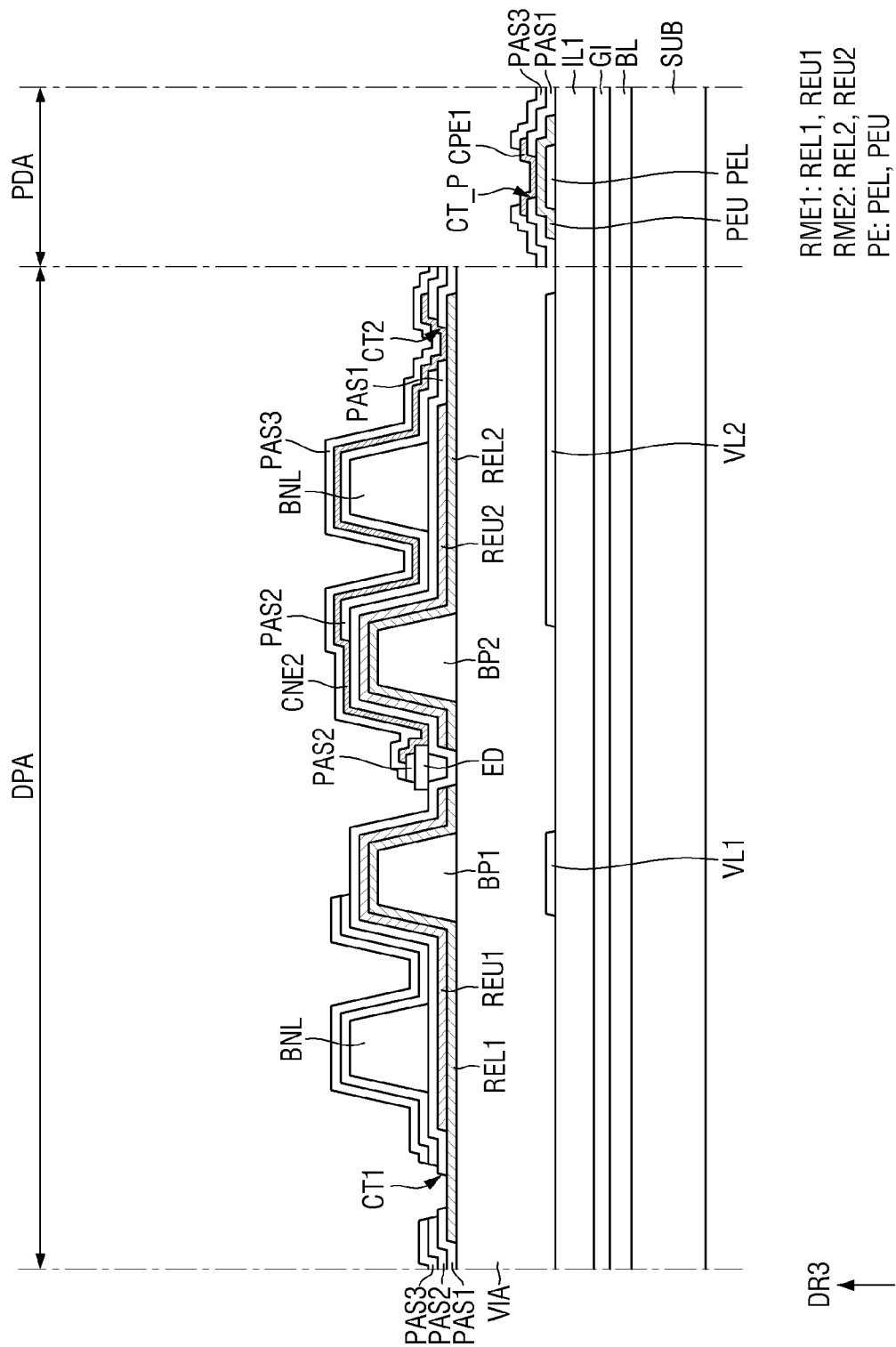

Referring to FIG. 18, the second connection electrode CNE2 disposed in the display area DPA and the first pad electrode capping layer CPE1 disposed in the pad area PDA may be formed, and the third insulation layer PAS3 may be formed thereon. The second connection electrode CNE2 may contact an end of the light emitting element ED exposed by the second insulating layer PAS2 and the second electrode base layer REL2 exposed by the second contact portion CT2, and the first pad electrode capping layer CPE1 may contact the pad electrode upper layer PEU exposed by the pad contact portion CT_P of the first insulating layer PAS1. The third insulating layer PAS3 may be disposed on the second insulating layer PAS2 and the second connection electrode CNE2, and may be formed to expose the other end of the light emitting element ED together with the second insulating layer PAS2. The third insulating layer PAS3 may expose the first contact portion CT1 and may cover the second contact portion CT2. Further, the third insulating layer PAS3 may be disposed on the first pad electrode capping layer CPE1 in the pad area PDA, and may be disposed to expose a part of the top surface of the first pad electrode capping layer CPE1.

Although not shown in the drawing, the display device 10 may be manufactured by forming the first connection electrode CNE1 disposed in the display area DPA and the second pad electrode capping layer CPE2 disposed in the pad area PDA.

Hereinafter, various embodiments of the display device 10 will be described with reference to other drawings.

Figure 19:
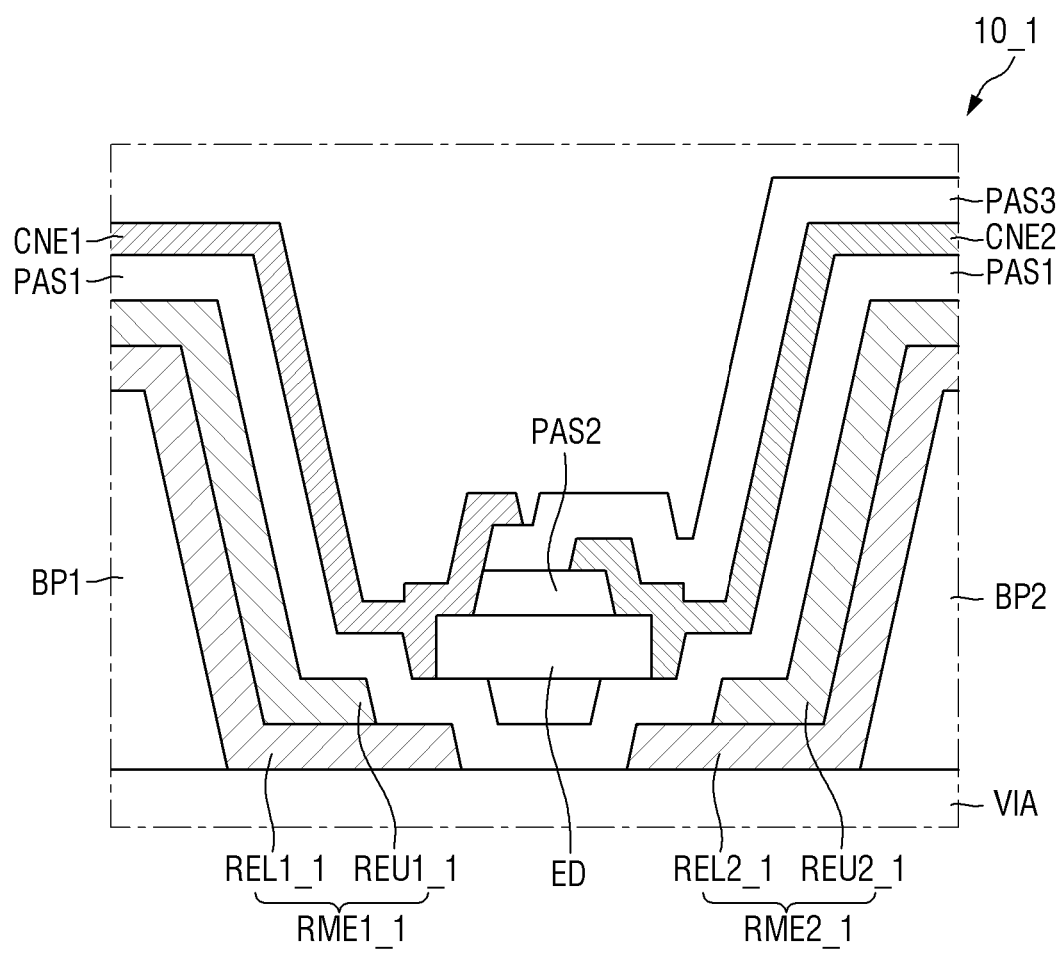
FIG. 19 is a schematic cross-sectional view illustrating a portion of a display device according to another embodiment.
Figure 20:
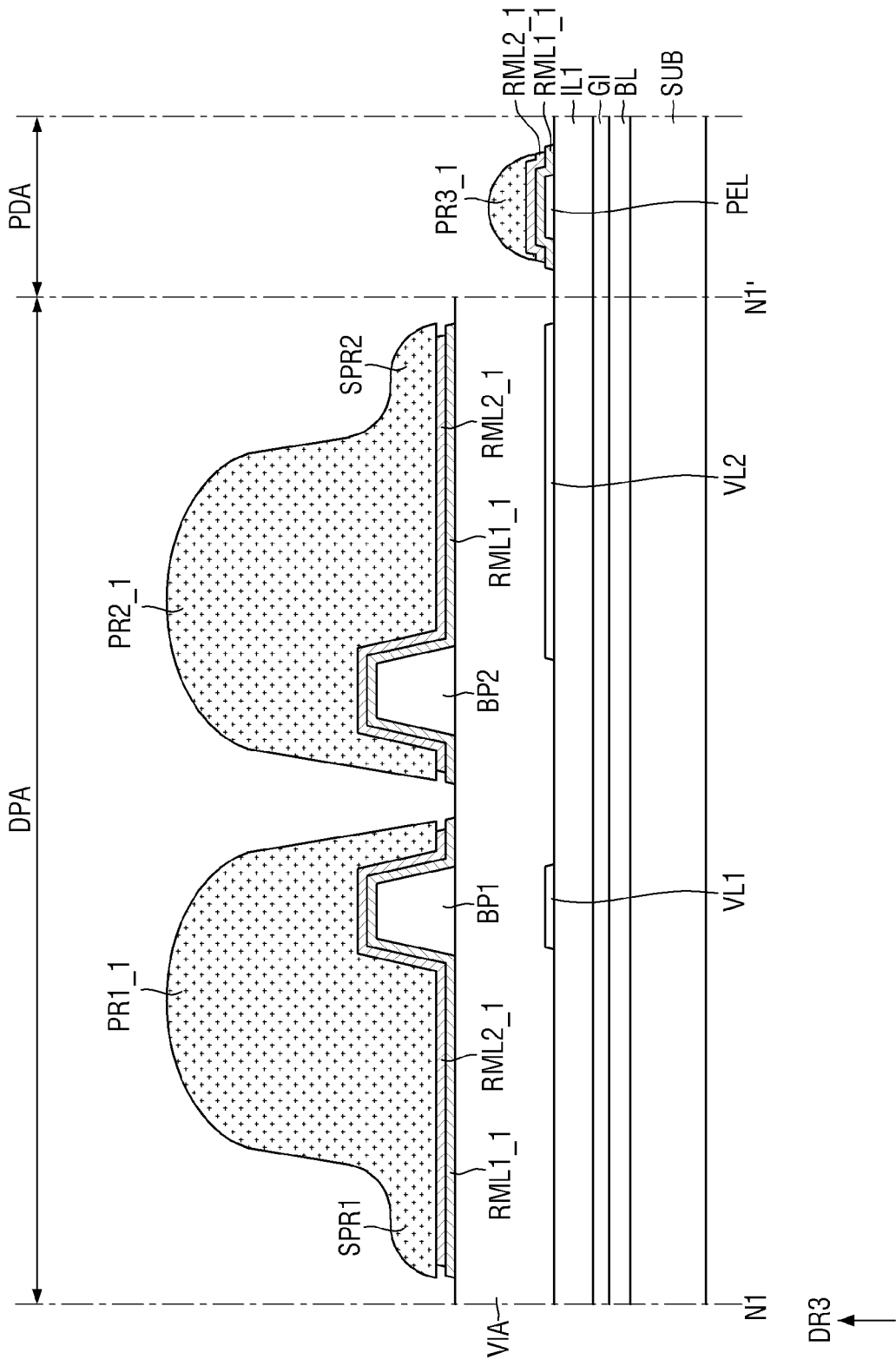
FIG. 20 is a schematic cross-sectional view illustrating a step in a fabricating process of the display device of FIG. 19.

FIG. 19 is a schematic cross-sectional view illustrating a portion of a display device according to another embodiment. FIG. 20 is a schematic cross-sectional view illustrating a step in a fabricating process of the display device of FIG. 19.

Referring to FIGS. 19 and 20, in a display device 10_1, the process of patterning metal layers RML1_1 and RML2_1 may be performed by the wet etching process, and electrode base layers REL1_1 and REL2_1 and electrode upper layers REU1_1 and REU2_1 may have a double taper shape. In the display device 10_1 according to an embodiment, sides of the electrode upper layers REU1_1 and REU2_1 facing each other may be inwardly spaced apart from sides of the electrode base layers REL1_1 and REL2_1 facing each other, respectively.

In case that the process of patterning the metal layers RML1_1 and RML2_1 using the photoresists PR1_1, PR2_1, and PR3_1 as a mask is performed by the wet etching process, the etch rates of the metal layers RML1_1 and RML2_1 may be different depending on types of a material and an etchant. For example, in case that the metal layers RML1_1 and RML2_1 are simultaneously etched using an etchant capable of etching the metal layers RML1_1 and RML2_1, the etch rate of the second metal layer RML2_1 may be higher than that of the first metal layer RML1_1. Accordingly, the second metal layer RML2_1 disposed under the photoresists PR1_1, PR2_1, and PR3_1 may be further etched, and the side of the patterned portion of the second metal layer RML2_1 may be inwardly recessed from the side of the patterned portion of the first metal layer RML1_1.

Accordingly side surfaces of the first electrode RME1_1 and the second electrode RME2_1 of the display device 10_1 facing each other may have a double taper shape. For example, a side of the first electrode upper layer REU1_1 facing the second electrode upper layer REU2_1 may be inwardly spaced apart from a side of the first electrode base layer REL1_1 facing the second electrode base layer REL2_1. Similarly, a side of the second electrode upper layer REU2_1 facing the first electrode upper layer REU1_1 may be inwardly spaced apart from a side of the second electrode base layer REL2_1 facing the first electrode base layer REL1_1. In other embodiments, in case that the etch rate of the first metal layer RML1_1 is higher than the etch rate of the second metal layer RML2_1, the taper shape may be reversed. In the display device 10_1 according to an embodiment, the patterning speeds of the metal layers RML1_1 and RML2_1 may be different depending on the type of the etching process performed in the manufacturing process, so that the taper shapes of the electrode base layers REL1_1 and REL2_1 and the electrode upper layers REU1_1 and REU2_1 may be different.

Figure 21:
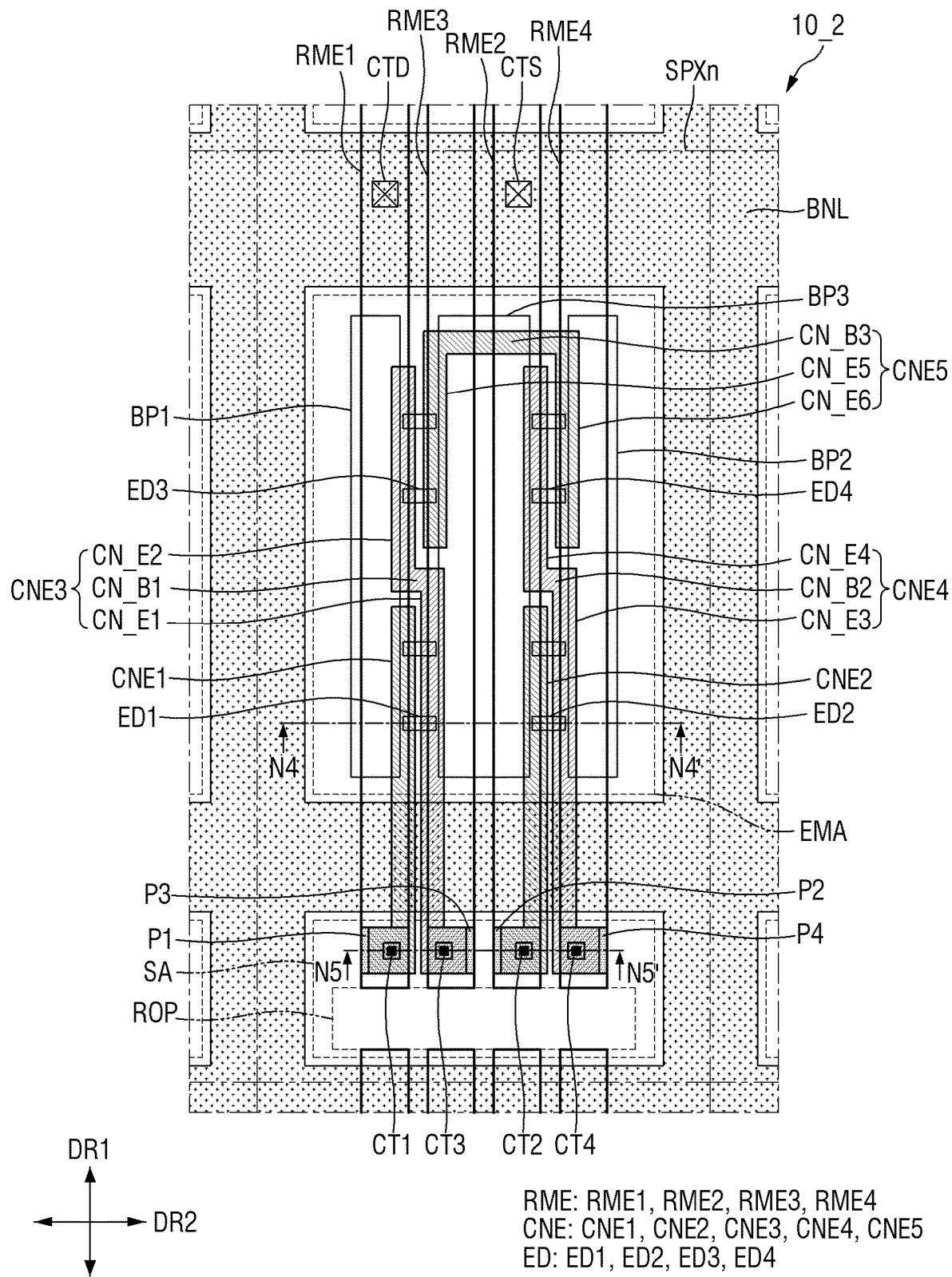
FIG. 21 is a schematic plan view illustrating a sub-pixel of a display device according to another embodiment.
Figure 22:
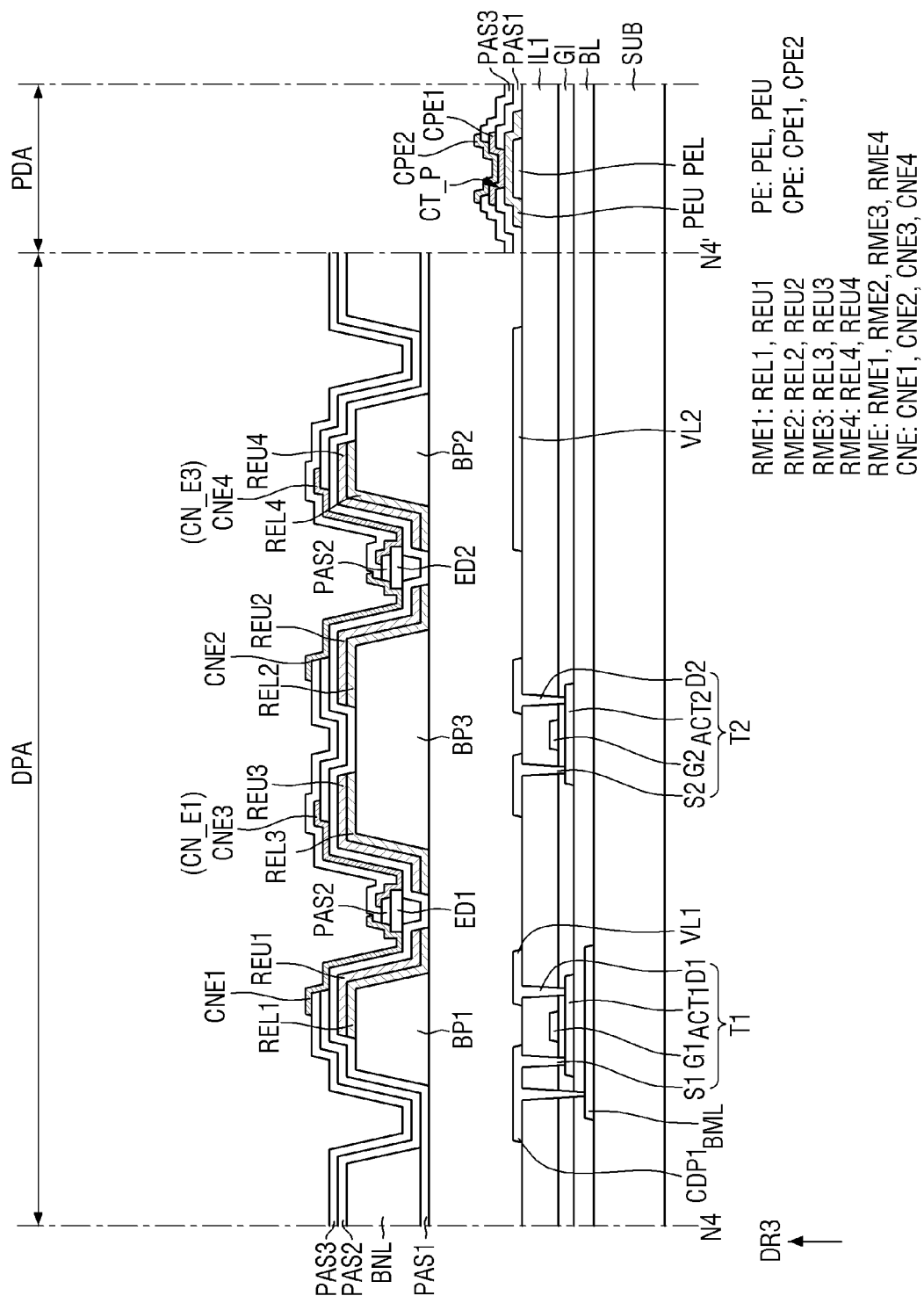
FIG. 22 is a schematic cross-sectional view illustrating a portion taken along line N4-N4' of FIG. 21 and a part of the pad area.
Figure 23:
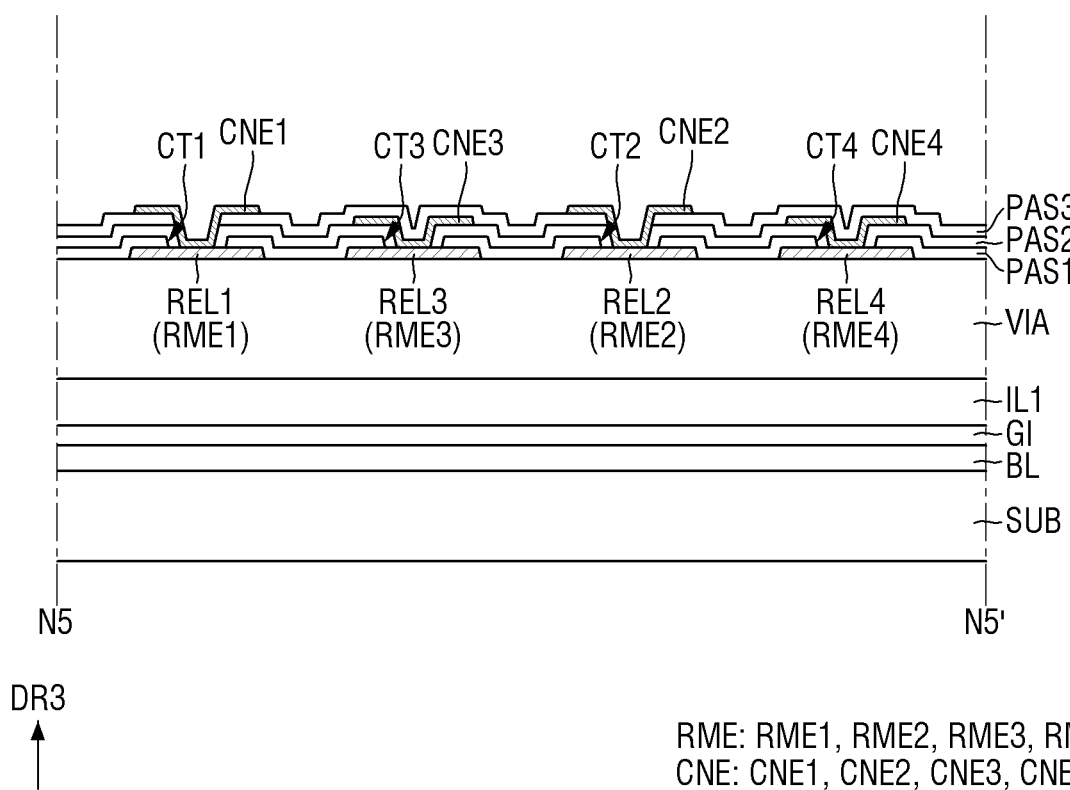
FIG. 23 is a schematic cross-sectional view taken along line N5-N5' of FIG. 21.

FIG. 21 is a schematic plan view illustrating a sub-pixel of a display device according to another embodiment. FIG. 22 is a schematic cross-sectional view illustrating a portion taken along line N4-N4' of FIG. 21 and a part of the pad area. FIG. 23 is a schematic cross-sectional view taken along line N5-N5' of FIG. 21. FIG. 22 illustrates a cross section across both ends of the first light emitting element ED1 and the second light emitting element ED2 of FIG. 21 and a cross section of the pad area PDA. FIG. 23 illustrates a cross section across contact portions CT1, CT2, CT3, and CT4 of FIG. 21.

Referring to FIGS. 21 to 23, a display device 10_2 according to an embodiment may include a larger number of electrodes RME and a larger number of connection electrodes CNE, and the number of light emitting elements ED arranged in each sub-pixel SPXn may be increased. An embodiment may be different from an embodiment of FIGS. 4 to 7 at least in that the arrangement of the electrodes RME and the connection electrodes CNE of each sub-pixel SPXn may be different and bank patterns BP1, BP2, and BP3 may be provided. In the following description, a redundant description will be omitted and differences will be described.

The bank patterns BP1, BP2, and BP3 may further include a third bank pattern BP3 disposed between the first bank pattern BP1 and the second bank pattern BP2. The first bank pattern BP1 may be located on the left side with respect to the center of the emission area EMA, the second bank pattern BP2 may be located on the right side with respect to the center of the emission area EMA, and the third bank pattern BP3 may be located at the center of the emission area EMA. The width of the third bank pattern BP3 measured in the second direction DR2 may be greater than those of the first bank pattern BP1 and the second bank pattern BP2 measured in the second direction DR2. The gap between the bank patterns BP1, BP2, and BP3 in the second direction DR2 may be greater than the gap between the electrodes RME. Accordingly, at least parts of the electrodes RME may be arranged without overlapping the bank patterns BP1, BP2, and BP3.

The electrodes RME arranged for each sub-pixel SPXn may further include a third electrode RME3 and a fourth electrode RME4 in addition to a first electrode RME1 and a second electrode RME2.

The third electrode RME3 may be disposed between the first electrode RME1 and the second electrode RME2, and the fourth electrode RME4 may be spaced apart from the third electrode RME3 in the second direction DR2 with the second electrode RME2 interposed therebetween. The electrodes RME may be sequentially arranged in the order of the first electrode RME1, the third electrode RME3, the second electrode RME2, and the fourth electrode RME4 from the left side to the right side of the sub-pixel SPXn.

The electrodes RME may include electrode base layers REL1, REL2, REL3, and REL4 and electrode upper layers REU1, REU2, REU3, and REU4, respectively. As described above with reference to FIGS. 4 to 7, the electrode upper layers REU1, REU2, REU3, and REU4 may be disposed on parts of the electrode base layers REL1, REL2, REL3, REL4, respectively, to expose parts of the top surfaces thereof. Similar to the first electrode RME1 and the second electrode RME2 including the first portion P1 and the second portion P2, respectively, the third electrode RME3 may include a third portion P3 in which the third electrode upper layer REU3 may not be disposed and the top surface of the third electrode base layer REL3 may be partially exposed, and the fourth electrode RME4 may include a fourth portion P4 in which the fourth electrode upper layer REU4 may not be disposed and the top surface of the fourth electrode base layer REL4 may be partially exposed. The first portion P1, the second portion P2, the third portion P3, and the fourth portion P4 may be disposed in the sub-region SA, and the contact portions CT1, CT2, CT3, and CT4 of the first insulating layer PAS1 may be disposed thereon.

Each of the electrodes RME may be disposed to extend from the emission area EMA up to the sub-region SA over the bank layer BNL. Among the electrodes RME, the first electrode RME1 and the second electrode RME2 may be connected to the third conductive layer disposed thereunder through the electrode contact holes CTD and CTS. However, the third electrode RME3 and the fourth electrode RME4 may not be directly connected to the third conductive layer disposed thereunder, and may be electrically connected to the first electrode RME1 and the second electrode RME2 through the light emitting elements ED and the connection electrodes CNE. The first electrode RME1 and the second electrode RME2 may be first type electrodes directly connected to the third conductive layer through the electrode contact holes CTD and CTS, and the third electrode RME3 and the fourth electrode RME4 may be second type electrodes that may not be directly connected to the third conductive layer. The second type electrodes may provide an electrical connection path of the light emitting elements ED together with the connection electrode CNE.

The light emitting elements ED may be arranged between the bank patterns BP1, BP2, and BP3 or on different electrodes RME. Some of the light emitting elements ED may be arranged between the first bank pattern BP1 and the third bank pattern BP3, and some other light emitting elements ED may be arranged between the third bank pattern BP3 and the second bank pattern BP2. In accordance with an embodiment, the light emitting element ED may include a first light emitting element ED1 and a third light emitting element ED3 arranged between the first bank pattern BP1 and the third bank pattern BP3, and a second light emitting element ED2 and a fourth light emitting element ED4 arranged between the third bank pattern BP3 and the second bank pattern BP2. The first light emitting element ED1 and the third light emitting element ED3 may be disposed on the first electrode RME1 and the third electrode RME3, respectively, and the second light emitting element ED2 and the fourth light emitting element ED4 may be disposed on the second electrode RME2 and the fourth electrode RME4, respectively. The first light emitting element ED1 and the second light emitting element ED2 may be arranged adjacent to the lower side of the emission area EMA of the corresponding sub-pixel SPXn or adjacent to the sub-region SA, and the third light emitting element ED3 and the fourth light emitting element ED4 may be arranged adjacent to the upper side of the emission area EMA of the corresponding sub-pixel SPXn. However, the light emitting elements ED may not be classified according to the arrangement position in the emission area EMA, but may be classified according to a connection relationship with the connection electrode CNE, which will be described later. Both ends of each light emitting element ED may contact different connection electrodes CNE according to an arrangement method of the connection electrodes CNE. The light emitting elements ED may be classified into different types of light emitting elements ED according to the type of the connection electrode CNE in contact therewith.

The arrangement of the first insulating layer PAS1 may be the same as described with reference to an embodiment of FIGS. 4 to 7. The first insulating layer PAS1 may be disposed in the entire sub-pixel SPXn and may include the contact portions CT1, CT2, CT3, and CT4.

Since a larger number of electrodes RME may be arranged for each sub-pixel SPXn, the number of the contact portions CT1, CT2, CT3, and CT4 may be increased. In an embodiment, in the sub-region SA, in addition to the first contact portion CT1 disposed on the first portion P1 of the first electrode RME1 and the second contact portion CT2 disposed on the second portion P2 of the second electrode RME2, the third contact portion CT3 disposed on the third portion P3 of the third electrode RME3 and the fourth contact portion CT4 disposed on the fourth portion P4 of the fourth electrode RME4 may be further disposed. The contact portions CT1, CT2, CT3, and CT4 may penetrate the first insulating layer PAS1 to expose parts of the top surfaces of the electrode base layers REL1, REL2, REL3, and REL4, respectively.

The connection electrodes CNE may further include, in addition to the first connection electrode CNE1 disposed on the first electrode RME1, the second connection electrode CNE2 disposed on the second electrode RME2, a third connection electrode CNE3, a fourth connection electrode CNE4, and a fifth connection electrode CNE5 arranged across the electrodes RME.

Unlike an embodiment of FIGS. 4 to 7, each of the first connection electrode CNE1 and the second connection electrode CNE2 may have a relatively short length extending in the first direction DR1. The first connection electrode CNE1 and the second connection electrode CNE2 may be arranged on the lower side with respect to the center of the emission area EMA. The first connection electrode CNE1 and the second connection electrode CNE2 may be disposed across the emission area EMA and the sub-region SA of the corresponding sub-pixel SPXn, and may contact the first electrode base layer REL1 and the second electrode base layer REL2 through the first contact portion CT1 and the second contact portion CT2 formed in the sub-region SA, respectively.

The third connection electrode CNE3 may include a first extension portion CN_E1 disposed on the third electrode RME3, a second extension portion CN_E2 disposed on the first electrode RME1, and a first connection portion CN_B1 that connects the first extension portion CN_E1 to the second extension portion CN_E2. The first extension portion CN_E1 may be spaced apart from the first connection electrode CNE1 in the second direction DR2, and the second extension portion CN_E2 may be spaced apart from the first connection electrode CNE1 in the first direction DR1. The first extension portion CN_E1 may be disposed on the lower side of the emission area EMA of the corresponding sub-pixel SPXn, and the second extension portion CN_E2 may be disposed on the upper side of the emission area EMA. The first extension portion CN_E1 may be disposed across the emission area EMA and the sub-region SA and may be connected to the third electrode base layer REL3 through the third contact portion CT3 formed in the sub-region SA. The first connection portion CN_B1 may be disposed across the first electrode RME1 and the third electrode RME3 at the central portion of the emission area EMA. The third connection electrode CNE3 may have a shape substantially extending in the first direction DR1, and may have a shape that may be bent in the second direction DR2 and extends in the first direction DR1 again.

The fourth connection electrode CNE4 may include a third extension portion CN_E3 disposed on the fourth electrode RME4, a fourth extension portion CN_E4 disposed on the second electrode RME2, and a second connection portion CN_B2 that connects the third extension portion CN_E3 to the fourth extension portion CN_E4. The third extension portion CN_E3 may face and be spaced apart from the second connection electrode CNE2 in the second direction DR2, and the fourth extension portion CN_E4 may be spaced apart from the second connection electrode CNE2 in the first direction DR1. The third extension portion CN_E3 may be disposed on the lower side of the emission area EMA of the corresponding sub-pixel SPXn, and the fourth extension portion CN_E4 may be disposed on the upper side of the emission area EMA. The third extension portion CN_E3 may be disposed in the emission area EMA and the sub-region SA and may be connected to the fourth electrode base layer REL4 through the fourth contact portion CT4. The second connection portion CN_B2 may be disposed across the second electrode RME2 and the fourth electrode RME4 while being adjacent to the center of the emission area EMA. The fourth connection electrode CNE4 may have a shape substantially extending in the first direction DR1, and may have a shape that may be bent in the second direction DR2 and extends in the first direction DR1 again.

The fifth connection electrode CNE5 may include a fifth extension portion CN_E5 disposed on the third electrode RME3, a sixth extension portion CN_E6 disposed on the fourth electrode RME4, and a third connection portion CN_B3 that connects the fifth extension portion CN_E5 to the sixth extension portion CN_E6. The fifth extension portion CN_E5 may face and be spaced apart from the second extension portion CN_E2 of the third connection electrode CNE3 in the second direction DR2, and the sixth extension portion CN_E6 may face and be spaced apart from the fourth extension portion CN_E4 of the fourth connection electrode CNE4 in the second direction DR2. Each of the fifth extension portion CN_E5 and the sixth extension portion CN_E6 may be arranged on the upper side of the emission area EMA, and the third connection portion CN_B3 may be disposed across the third electrode RME3, the second electrode RME2, and the fourth electrode RME4. The fifth connection electrode CNE5 may be disposed to surround the fourth extension portion CN_E4 of the fourth connection electrode CNE4 in plan view.

The first connection electrode CNE1 and the second connection electrode CNE2 may be the first type connection electrodes contacting the first electrode RME1 and the second electrode RME2 directly connected to the third conductive layer, respectively. The third connection electrode CNE3 and the fourth connection electrode CNE4 may be the second type connection electrodes contacting the third electrode RME3 and the fourth electrode RME4, respectively, that may not be directly connected to the third conductive layer. The fifth connection electrode CNE5 may be a third type connection electrode that may not contact the electrodes RME.

As described above, the light emitting elements ED may be classified into different light emitting elements ED depending on the connection electrodes CNE to contact both ends of the light emitting elements ED to correspond to the arrangement structure of the connection electrodes CNE.

The first light emitting element ED1 and the second light emitting element ED2 may have first ends contacting the first type connection electrodes and second ends contacting the second type connection electrodes. The first light emitting element ED1 may contact the first connection electrode CNE1 and the third connection electrode CNE3, and the second light emitting element ED2 may contact the second connection electrode CNE2 and the second connection electrode CNE4. The third light emitting element ED3 and the fourth light emitting element ED4 may have first ends contacting the second type connection electrodes and second ends contacting the third type connection electrodes. The third light emitting element ED3 may contact the third connection electrode CNE3 and the fifth connection electrode CNE5, and the fourth light emitting element ED4 may contact the fourth connection electrode CNE4 and the fifth connection electrode CNE5.

The light emitting elements ED may be connected in series through the connection electrodes CNE. Since the display device 10_3 according to an embodiment includes a larger number of light emitting elements ED for each sub-pixel SPXn and the light emitting elements ED may be connected in series, the light emission amount per unit area may be further increased.

Figure 24:
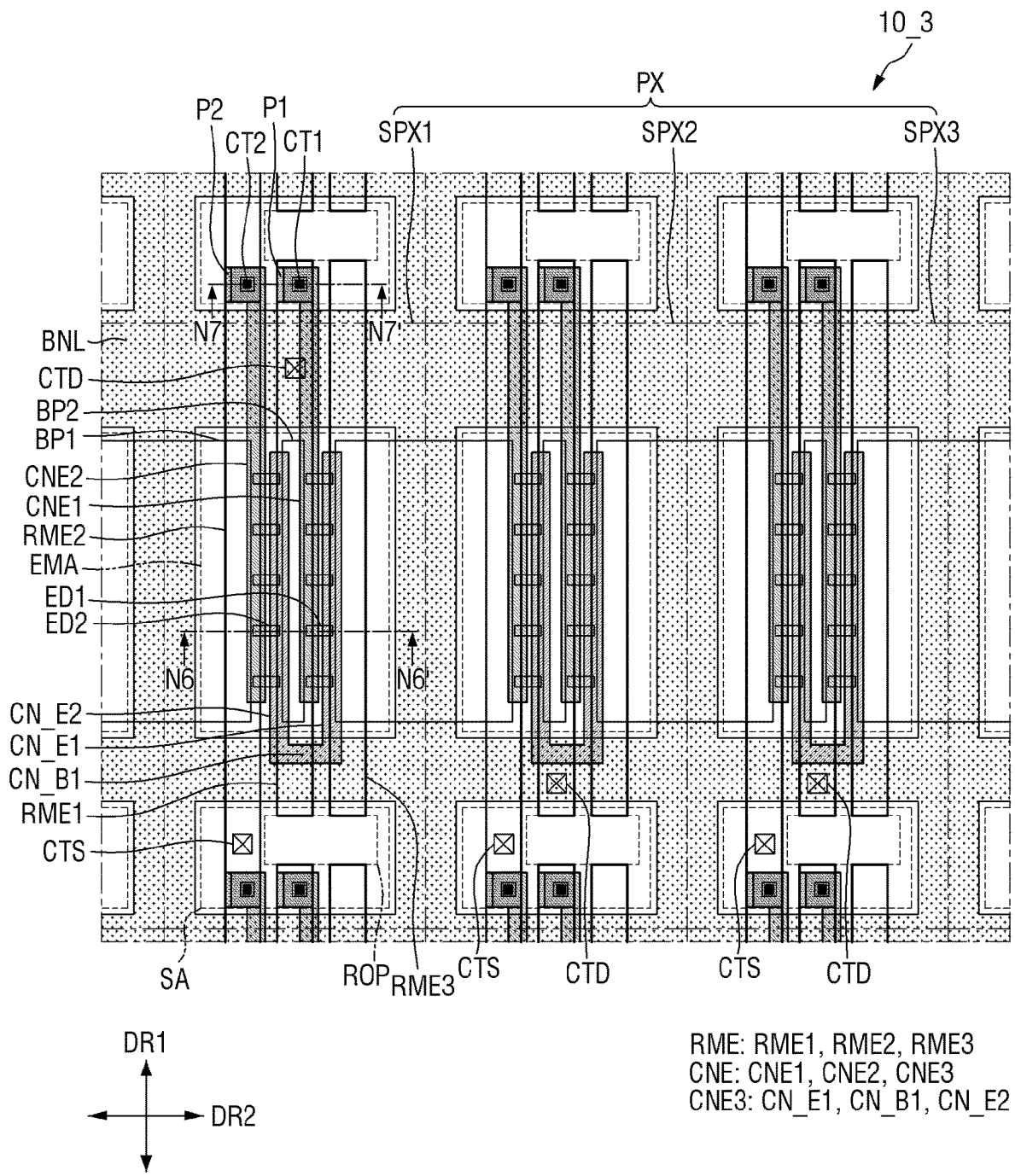
FIG. 24 is a schematic plan view illustrating a pixel of a display device according to another embodiment.
Figure 25:
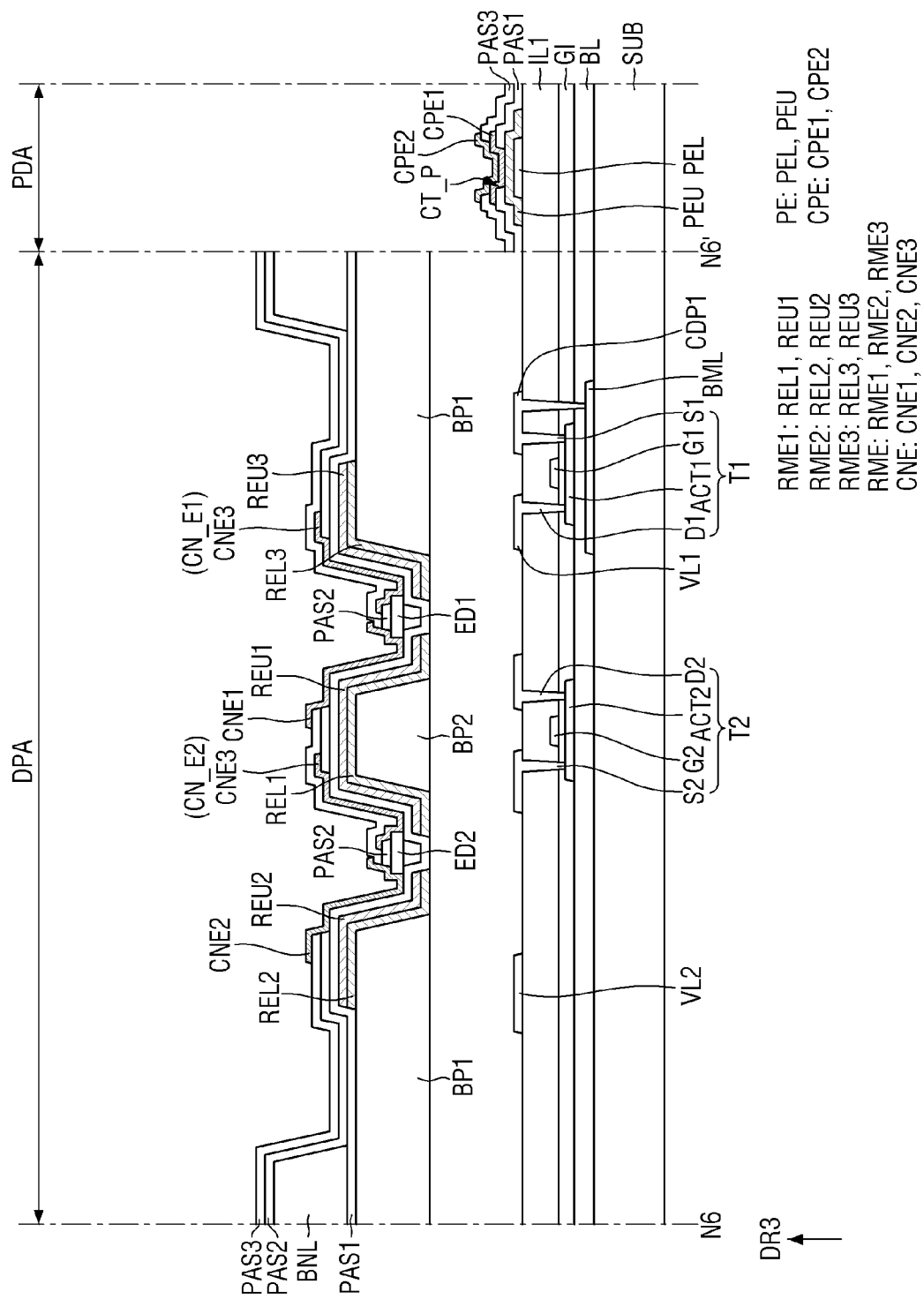
FIG. 25 is a schematic cross-sectional view showing a portion taken along line N6-N6' of FIG. 24 and a part of the pad area.
Figure 26:
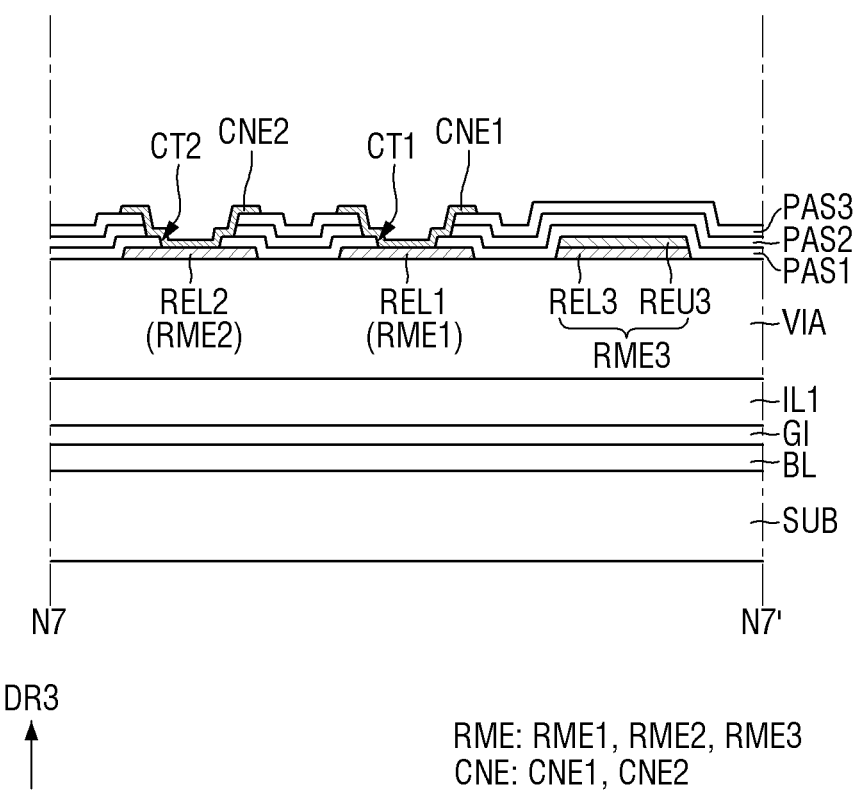
FIG. 26 is a schematic cross-sectional view taken along line N7-N7' of FIG. 24.

FIG. 24 is a schematic plan view illustrating a pixel of a display device according to another embodiment. FIG. 25 is a schematic cross-sectional view showing a portion taken along line N6-N6' of FIG. 24 and a part of the pad area. FIG. 26 is a schematic cross-sectional view taken along line N7-N7' of FIG. 24. FIG. 25 illustrates a cross section across both ends of the first light emitting element ED1 and the second light emitting element ED2 in the first sub-pixel SPX1 of FIG. 24 and a cross section of the pad area PDA. FIG. 26 illustrates a cross section across the contact portions CT1 and CT2 of FIG. 24.

Referring to FIGS. 24 to 26, in a display device 10_3 according to an embodiment, at least the structures of the electrode RME, the connection electrode CNE, and the bank patterns BP1 and BP2 may be different from those in the above-described embodiments.

The bank patterns BP1 and BP2 may have different widths measured in the second direction DR2, and any of the bank patterns BP1 and BP2 may be disposed across sub-pixels SPXn adjacent in the second direction DR2. For example, the bank patterns BP1 and BP2 may include the first bank pattern BP1 disposed across the emission areas EMA of different sub-pixels SPXn, and the second bank pattern BP2 disposed between the first bank patterns BP1 in the emission area EMA of each sub-pixel SPXn.

The second bank pattern BP2 may be disposed in the center of the emission areas EMA, and the first bank patterns BP1 may be disposed to be spaced apart from the second bank pattern BP2 interposed therebetween. The first bank pattern BP1 and the second bank pattern BP2 may be alternately disposed along the second direction DR2. The light emitting elements ED may be disposed between the first bank pattern BP1 and the second bank pattern BP2 that may be spaced apart from each other.

The first bank pattern BP1 and the second bank pattern BP2 may have a same length in the first direction DR1, but may have different widths measured in the second direction DR2. In the bank layer BNL, a portion extending in the first direction DR1 may overlap the first bank pattern BP1 in the thickness direction. The bank patterns BP1 and BP2 may be disposed in an island-like pattern on the entire surface of the display area DPA.

The electrodes RME may include the first electrode RME1, the second electrode RME2, and the third electrode RME3. The first electrode RME1 may be disposed at the center of the emission area EMA, the second electrode RME2 may be disposed on the left side of the first electrode RME1, and the third electrode RME3 may be disposed on the right side of the first electrode RME1.

The first electrode RME1 may be disposed on the second bank pattern BP2, and parts of the second electrode RME2 and the third electrode RME3 may be disposed respectively on the first bank patterns BP1 different from each other. The electrodes RME may be disposed at least on the inclined side surfaces of the bank patterns BP1 and BP2. The first electrode RME1 may have a larger width in the second direction DR2 than the second bank pattern BP2, and the second electrode RME2 and the third electrode RME3 may have a smaller width in the second direction DR2 than the first bank pattern BP1.

The first electrode RME1 and the third electrode RME3 may extend in the first direction DR1 and may be spaced apart from the first electrode RME1 and the third electrode RME3 of another sub-pixel SPXn at the separation portion ROP of each sub-region SA. On the other hand, the second electrode RME2 may extend in the first direction DR1 and be disposed in the sub-pixels SPXn arranged in the first direction DR1.

The first electrode RME1 may be connected to the third conductive layer through the first electrode contact hole CTD formed in a portion overlapping the bank layer BNL. The first electrode RME1 of the first sub-pixel SPX1 may contact the third conductive layer through the first electrode contact hole CTD penetrating the via layer VIA in a portion overlapping the bank layer BNL positioned on the upper side of the emission area EMA. On the other hand, the first electrode RME1 of the second sub-pixel SPX2 and the third sub-pixel SPX3 may be connected to the third conductive layer through the first electrode contact hole CTD penetrating the via layer VIA in a portion overlapping the bank layer BNL positioned on the lower side of the emission area EMA. The positions of the first electrode contact holes CTD of different sub-pixels SPXn may vary depending on the structure of the third conductive layer disposed in the area occupied by each sub-pixel SPXn.

The second electrode RME2 may be connected to the second voltage line VL2 through the second electrode contact hole CTS penetrating the via layer VIA in the sub-region SA positioned on the lower side of the emission areas EMA.

Similar to the above-described embodiments, the electrodes RME may include the electrode base layers REL1, REL2, and REL3 and the electrode upper layers REU1, REU2, and REU3, respectively. Unlike the first electrode RME1 and the second electrode RME2 including the first portion P1 and the second portion P2, respectively, the third electrode RME3 may not include the portions in which the electrode base layers REL1, REL2, and REL3 may be exposed because the electrode upper layers REU1, REU2, and REU3 may not be disposed. For example, the third electrode base layer REL3 and the third electrode upper layer REU3 may have a same pattern shape.

The first portion P1 and the second portion P2 of the first electrode RME1 and the second electrode RME2 may be the portions in which the connection electrodes CNE may contact the electrode base layers REL1, REL2, and REL3. However, if the electrode RME is not in direct contact with the connection electrode CNE, in the third electrode RME3, the third electrode base layer REL3 may be completely covered by the third electrode upper layer REU3 without being exposed. The first insulating layer PAS1 may include the first contact portion CT1 and the second contact portion CT2 disposed on the first portion P1 and the second portion P2, respectively, and may not expose a part of the top surface of the third electrode RME3.

The light emitting elements ED may be disposed on different electrodes RME between different bank patterns BP1 and BP2. The light emitting elements ED may include a first light emitting element ED1 whose both ends may be respectively disposed on the first electrode RME1 and the third electrode RME3, and a second light emitting element ED2 whose both ends may be respectively disposed on the first electrode RME1 and the second electrode RME2. The first light emitting elements ED1 may be disposed on the right side with respect to the first electrode RME1, and the second light emitting elements ED2 may be disposed on the left side with respect to the first electrode RME1.

The connection electrodes CNE (CNE1, CNE2, and CNE3) may include the first and second connection electrodes CNE1 and CNE2, which may be first type connection electrodes, and the third connection electrode CNE3 which may be a third type connection electrode.

The first connection electrode CNE1 may have a shape extending in the first direction DR1 and may be disposed on the first electrode RME1. A portion of the first connection electrode CNE1 disposed on the second bank pattern BP2 may overlap the first electrode RME1, extend in the first direction DR1 therefrom to cross the bank layer BNL, and be disposed up to the sub-region SA of another sub-pixel SPXn positioned on the upper side of the emission area EMA. The first connection electrode CNE1 may contact the first electrode base layer REL1 through the first contact portion CT1 in the sub-region SA.

The second connection electrode CNE2 may have a shape extending in the first direction DR1 and may be disposed on the second electrode RME2. A portion of the second connection electrode CNE2 disposed on the first bank pattern BP1 may overlap the second electrode RME2, extend in the first direction DR1 therefrom to cross the bank layer BNL, and be disposed up to the sub-region SA of another sub-pixel SPXn positioned on the upper side of the emission area EMA. The second connection electrode CNE2 may contact the second electrode base layer REL2 through the second contact portion CT2 in the sub-region SA.

The third connection electrode CNE3 may include extension portions CN_E1 and CN_E2 extending in the first direction DR1 and a first connection portion CN_B1 connecting the extension portions CN_E1 and CN_E2. A first extension portion CN_E1 may be disposed on the third electrode RME3 in the emission area EMA, and a second extension portion CN_E2 may be disposed on the first electrode RME1 in the emission area EMA. The first connection portion CN_B1 may extend in the second direction DR2 on the bank layer BNL, which may be disposed at the lower side of the emission area EMA, to connect the first extension portion CN_E1 to the second extension portion CN_E2. The third connection electrode CNE3 may be disposed in the emission area EMA and on the bank layer BNL, and may not be connected to the third electrode RME3.

In the third electrode RME3, the third electrode base layer REL3 and the third electrode upper layer REU3 may have a same pattern shape and may be completely covered by the first insulating layer PAS1. The third electrode RME3 may not include a portion in which the top surface of the third electrode base layer REL3 may be exposed in the sub-region SA, and may be disposed in a floating state without being electrically connected to the connection electrode CNE and the light emitting element ED. The first light emitting element ED1 and the second light emitting element ED2 may be connected in series only through the third connection electrode CNE3.

As in an embodiment of FIG. 24, the third electrode RME3 may remain in the floating state without being connected to the connection electrode CNE, but may be connected to another adjacent electrode RME in some embodiments. For example, the third electrode RME3 may be connected to the second electrode RME2 disposed in another sub-pixel SPXn adjacent in the second direction DR2, and the second power voltage may be applied to the third electrode RME3. Even in case that the second power voltage is applied to the third electrode RME3, since the third electrode RME3 may not be connected to another connection electrode CNE, the second power voltage applied to the third electrode RME3 may not affect light emission of the light emitting elements ED. The third electrode RME3 may have a shape branched from the second electrode RME2 of an adjacent sub-pixel SPXn, and only the first electrode RME1 may be separated at the separation portion ROP of the sub-region SA.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
    a substrate including:
        a display area; and
        a pad area adjacent to the display area;
    a pad electrode base layer disposed in the pad area on the substrate;
    an electrode base layer including:
        a first electrode base layer disposed in the display area on the substrate; and
        a second electrode base layer spaced apart from the first electrode base layer in the display area;
    a pad electrode upper layer disposed on the pad electrode base layer;
    an electrode upper layer including:
        a first electrode upper layer disposed on the first electrode base layer; and
        a second electrode upper layer disposed on the second electrode base layer;
    a first insulating layer disposed on the electrode upper layer and the pad electrode upper layer; and
    a light emitting element disposed on the first electrode base layer and the second electrode base layer on the first insulating layer, wherein
    the first electrode upper layer and the second electrode upper layer are disposed to partially expose a top surface of the first electrode base layer and a top surface of the second electrode base layer, respectively,
    the first insulating layer includes contact portions partially exposing a top surface of the first electrode base layer, a top surface of the second electrode base layer, and a top surface of the pad electrode upper layer, the contact portions including:
        a first contact portion exposing a part of a top surface of the first electrode base layer where the first electrode upper layer is not disposed; and
        a second contact portion exposing a part of a top surface of the second electrode base layer where the second electrode upper layer is not disposed.

2. The display device of claim 1, wherein
    the first electrode upper layer includes aluminum (Al), and
    the first electrode base layer includes a conductive material that does not include aluminum (Al).

3. The display device of claim 2, wherein the pad electrode upper layer, the first electrode base layer and the second electrode base layer include a same material.

4. The display device of claim 1, wherein a side surface of the first electrode upper layer facing the second electrode base layer and a side surface of the first electrode base layer facing the second electrode base layer are disposed on a same plane.

5. The display device of claim 1, wherein a side of the first electrode upper layer facing the second electrode upper layer is disposed inwardly spaced apart from a side of the first electrode base layer facing the second electrode base layer.

6. The display device of claim 1, further comprising:
    a second insulating layer disposed on the light emitting element in the display area.

7. The display device of claim 6, further comprising:
    a third insulating layer disposed on the second insulating layer in the display area and disposed on the first insulating layer in the pad area,
    wherein the third insulating layer exposes a part of a top surface of the pad electrode upper layer.

8. The display device of claim 7, further comprising:
    a first pad electrode capping layer disposed on the first insulating layer and the pad electrode upper layer in the pad area; and
    a second pad electrode capping layer disposed on the first pad electrode capping layer,
    wherein a part of the third insulating layer is disposed between the first pad electrode capping layer and the second pad electrode capping layer.

9. The display device of claim 1, further comprising:
    a first connection electrode disposed on the first electrode base layer and the first electrode upper layer and electrically contacting the light emitting element; and
    a second connection electrode disposed on the second electrode base layer and the second electrode upper layer and electrically contacting the light emitting element.

10. The display device of claim 9, wherein the first connection electrode electrically contacts the first electrode base layer through the first contact portion exposing the part of the top surface of the first electrode base layer where the first electrode upper layer is not disposed, and the second connection electrode electrically contacts the second electrode base layer through the second contact portion exposing the part of the top surface of the second electrode base layer where the second electrode upper layer is not disposed.

11. The display device of claim 10, further comprising a bank layer surrounding an area in which the light emitting elements are disposed on the first insulating layer, wherein the first contact portion and the second contact portion are disposed outside the bank layer surrounding the area in which the light emitting elements are disposed, and each of the first connection electrode and the second connection electrode is partially disposed on the bank layer.

12. A display device comprising:
a substrate including:
　a display area; and
　a pad area adjacent to the display area;
a pad electrode base layer disposed in the pad area on the substrate;
an electrode base layer including:
　a first electrode base layer disposed in the display area on the substrate; and
　a second electrode base layer spaced apart from the first electrode base layer in the display area;
a pad electrode upper layer disposed on the pad electrode base layer;
an electrode upper layer including:
　a first electrode upper layer disposed on the first electrode base layer; and
　a second electrode upper layer disposed on the second electrode base layer;
a first insulating layer disposed on the electrode upper layer and the pad electrode upper layer; and
a light emitting element disposed on the first electrode base layer and the second electrode base layer on the first insulating layer, wherein the first electrode upper layer and the second electrode upper layer are disposed to partially expose a top surface of the first electrode base layer and a top surface of the second electrode base layer, respectively, the first insulating layer includes contact portions partially exposing a top surface of the first electrode base layer, a top surface of the second electrode base layer, and a top surface of the pad electrode upper layer, the display device further comprises:
　a via layer disposed between the substrate and the electrode base layer;
　a first conductive layer disposed between the via layer and the substrate; and
　an interlayer insulating layer disposed between the first conductive layer and the substrate, and
the pad electrode base layer and the first conductive layer are disposed on a same layer.

13. The display device of claim 12, wherein the first electrode base layer electrically contacts a conductive pattern of the first conductive layer through a first electrode contact hole penetrating the via layer, and the second electrode base layer electrically contacts a voltage line of the first conductive layer through a second electrode contact hole penetrating the via layer.

14. The display device of claim 13, wherein
the first electrode upper layer is disposed on the first electrode contact hole, and the second electrode upper layer is disposed on the second electrode contact hole.

15. The display device of claim 12, further comprising:
a first bank pattern disposed between the via layer and the first electrode base layer, and
a second bank pattern disposed between the via layer and the second electrode base layer.

16. A display device comprising:
a first electrode extending in a first direction and including:
　a first electrode base layer; and
　a first electrode upper layer partially disposed on the first electrode base layer;
a second electrode spaced apart from the first electrode in a second direction and extending in the first direction, the second electrode including:
　a second electrode base layer spaced apart from the first electrode base layer in the second direction; and
　a second electrode upper layer partially disposed on the second electrode base layer;
light emitting elements disposed on the first electrode and the second electrode;
a first connection electrode disposed on the first electrode and electrically contacting the light emitting element;
a second connection electrode disposed on the second electrode and electrically contacting the light emitting element; and
a first insulating layer disposed on the first electrode and the second electrode, wherein the first electrode base layer includes a first portion on which the first electrode upper layer is not disposed;

the second electrode base layer includes a second portion on which the second electrode upper layer is not disposed, the first connection electrode electrically contacts the first portion of the first electrode base layer, the second connection electrode electrically contacts the second portion of the second electrode base layer, the first insulating layer includes at least one contact portion exposing at least one of the first portion and the second portion, and the first electrode upper layer and the first electrode base layer include conductive materials that include at least one material different from each other.

17. The display device of claim 16, wherein
the first electrode upper layer includes aluminum (Al), and
the first electrode base layer includes a conductive material that does not include aluminum (Al).

18. The display device of claim 16,
wherein the first insulating layer includes:
　a first contact portion exposing the first portion of the first electrode base layer; and
　a second contact portion exposing the second portion of the second electrode base layer.

19. The display device of claim 16, further comprising:
a bank layer surrounding an emission area in which the light emitting elements are disposed, and
a sub-region adjacent to the emission area,
wherein each of the first portion of the first electrode base layer and the second portion of the second electrode base layer is disposed in the sub-region.

20. The display device of claim 19, wherein each of the first connection electrode and the second connection electrode is disposed from the emission area to the sub-region over the bank layer.

* * * * *